(12) United States Patent
Tamagawa et al.

(10) Patent No.: US 7,217,998 B2
(45) Date of Patent: May 15, 2007

(54) SEMICONDUCTOR DEVICE HAVING A HEAT-DISSIPATION MEMBER

(75) Inventors: Michiaki Tamagawa, Aizuwakamatsu (JP); Takuya Suzuki, Aizuwakamatsu (JP); Hiroyuki Sasaki, Aizuwakamatsu (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/994,680

(22) Filed: Nov. 23, 2004

(65) Prior Publication Data
US 2006/0043583 A1    Mar. 2, 2006

(30) Foreign Application Priority Data
Aug. 31, 2004    (JP)    ............... 2004-253112

(51) Int. Cl.
*H01L 23/10*    (2006.01)
*H01L 23/34*    (2006.01)

(52) U.S. Cl. ............... 257/707; 257/712; 257/713; 257/E23.036

(58) Field of Classification Search ............... 257/706, 257/707, 712, 713, E23.036
See application file for complete search history.

(56) References Cited

U.S. PATENT DOCUMENTS 6,081,426 A * 6/2000 Takeda et al. ............... 361/704

2004/0135246 A1 * 7/2004 Kim et al. ............... 257/712
2005/0046017 A1 * 3/2005 Dangelo ............... 257/720
2005/0269689 A1 * 12/2005 Tetsuka ............... 257/706

FOREIGN PATENT DOCUMENTS

| JP | 2000-216284 | 8/2000 |
| JP | 2001-168244 | 6/2001 |
| JP | 2003-204015 | 7/2003 |
| WO | WO98/49726 | 11/1998 |

* cited by examiner

*Primary Examiner*—Ngân V. Ngô
(74) *Attorney, Agent, or Firm*—Westerman, Hattori, Daniels & Adrian, LLP.

(57) ABSTRACT

A semiconductor device is disclosed that includes a semiconductor element, a circuit board electrically connected to the semiconductor element, a heat dissipation member fixed to the first surface of the circuit board and thermally coupled to the semiconductor element, and an interposer provided to the second surface of the circuit board facing away from the heat dissipation member. The interposer is electrically connected to the circuit board. An opening is formed in the circuit board and the interposer so that the semiconductor element is thermally coupled directly to the heat dissipation member through the opening.

34 Claims, 17 Drawing Sheets

SEMICONDUCTOR DEVICE HAVING A HEAT-DISSIPATION MEMBER

CROSS-REFERENCE TO RELATED APPLICATION

The present application is based on Japanese Priority Patent Application No. 2004-253112, filed on Aug. 31, 2004, the entire contents of which are hereby incorporated by reference.

BACKGROUND OF THE INVENTION

1. Field of the Invention

The present invention generally relates to semiconductor devices, and more particularly to a semiconductor device including a heat dissipation member that dissipates heat generated in a semiconductor element.

2. Description of the Related Art

In recent years, semiconductor elements provided inside semiconductor devices have become higher in density and speed. As a result, the amount of heat generated during operation has been on the increase. On the other hand, there is a demand for smaller semiconductor devices.

Accordingly, there is a demand for a semiconductor device that can dissipate heat generated in a semiconductor element with efficiency while being reduced in size.

For instance, International Publication No. WO98/49726 (Patent-Related Document 1) and Japanese Laid-Open Patent Applications No. 2000-216284 (Patent-Related Document 2), No. 2001-168244 (Patent-Related Document 3) and No. 2003-204015 (Patent-Related Document 4) disclose conventional semiconductor devices including a heat dissipation member. According to the semiconductor device disclosed in Patent-Related Document 1, interconnection lines are formed on an insulating substrate so that one end of each interconnection line is connected to a semiconductor element by a wire and an external electrode is provided to the other end of each interconnection line. The semiconductor element is thermally coupled to a metal plate (a heat dissipation plate) provided to the insulating substrate. However, according to the semiconductor device of Patent-Related Document 1, a circuit board formed of the interconnection lines and the insulating substrate is pressed. Accordingly, there is a problem in that the circuit board is restricted in material selection. Further, since pressing is employed, there is a problem in that it is difficult to obtain dimensional accuracy that enables narrow pitch.

The semiconductor device disclosed in Patent-Related Document 2 is of a BGA (Ball Grid Array) type. Press punching is performed on the first and second heat sinks and the circuit board of the semiconductor device in order to form a recess in its semiconductor element part. Accordingly, there is also a problem in that the circuit board and the heat sinks are restricted in material selection in the semiconductor device of Patent-Related Document 2.

Further, the semiconductor element and the electric circuit board are connected by wire bonding, and the electrode surface of the semiconductor element and a surface on which solder balls (external connection terminals) are provided are in the same plane. Accordingly, there is a problem in that the solder balls are restricted in size and wire bonding is restricted in loop shape in order to prevent mutual interference.

The semiconductor device disclosed in Patent-Related Document 3 is also of a BGA type, and requires press working in order to form a recess for containing a semiconductor element part in a heat spreader. Accordingly, in Patent-Related Document 3, there is also a problem in that the semiconductor device is increased in size. Further, a semiconductor element and an electric circuit board are connected by wire bonding, and a surface on which solder balls are provided and a surface on which wires are provided are in the same plane. Accordingly, there is a problem in that the size of the solder balls and the loop shape of wire bonding are subject to restrictions in sealing the semiconductor element with resin.

Meanwhile, no press working is performed on the semiconductor device disclosed in Patent-Related Document 4, in which a metal base serving as a heat dissipation plate is like a flat plate. Further, a semiconductor element and interconnection lines formed on an insulating layer are connected with wires, and an interposer substrate is provided on the insulating layer on which the interconnection lines are formed. Since solder balls are formed on the interposer substrate, the loop height of wire bonding is offset by the thickness of the interposer substrate. Accordingly, the loop height of wire bonding and the ball size of the solder balls can be set as desired without mutual interference. Thus, the semiconductor device disclosed in Patent-Related Document 4 can eliminate the disadvantages of the above-described semiconductor devices of Patent-Related Documents 1 through 3, and can be reduced in cost, higher in reliability, narrower in pitch, and reduced in size.

However, according to the semiconductor device of Patent-Related Document 4, a resin substrate is provided between the semiconductor element and the metal base serving as a heat dissipation plate. This prevents efficient transfer of heat generated in the semiconductor element to the metal base, thus resulting in the problem of poor heat dissipation characteristics.

SUMMARY OF THE INVENTION

Accordingly, it is a general object of the present invention to provide a semiconductor device in which the above-described disadvantages are eliminated.

A more specific object of the present invention is to provide a semiconductor device that can dissipate heat generated in a semiconductor element with efficiency while being reduced in cost, higher in reliability, narrower in pitch, and reduced in size.

The above objects of the present invention are achieved by a semiconductor device, including: a semiconductor element; a circuit board electrically connected to the semiconductor element; a heat dissipation member fixed to a first surface of the circuit board and thermally coupled to the semiconductor element; and an interposer provided to a second surface of the circuit board facing away from the heat dissipation member, the interposer being electrically connected to the circuit board, wherein an opening is formed in the circuit board and the interposer so that the semiconductor element is thermally coupled directly to the heat dissipation member through the opening.

According to one embodiment of the present invention, in a semiconductor device, a semiconductor element is thermally coupled directly to a heat dissipation member through an opening formed in a circuit board and an interposer. Accordingly, although the circuit board and the interposer are provided, low thermal resistance can be obtained with respect to heat dissipation, so that heat generated in the semiconductor element can be dissipated with efficiency.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given, with reference to accompanying drawings, of embodiments of the present invention.

Figure 1:
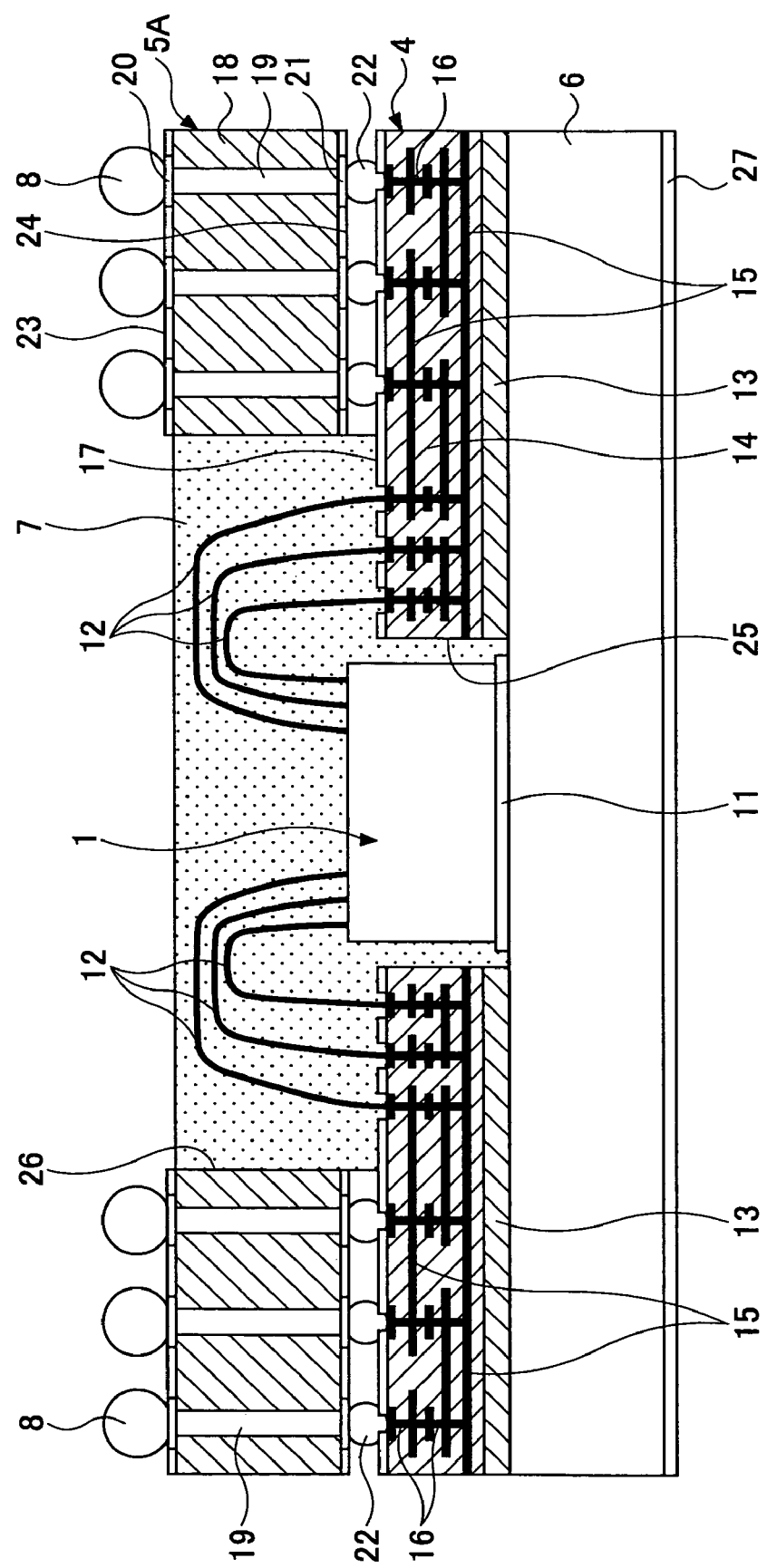
FIG. 1 is a cross-sectional view of a semiconductor device according to a first embodiment of the present invention.
Figure 2A:
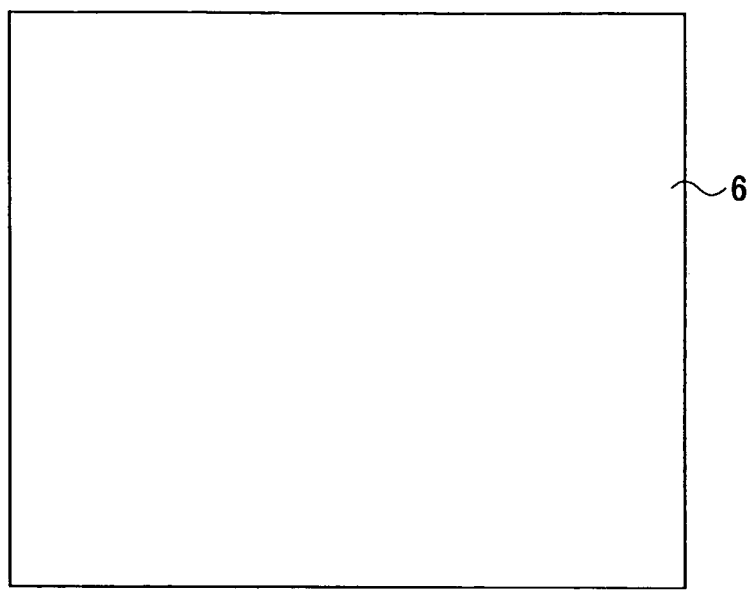
FIGS. 2A through 2C are a schematic lower side view, a schematic front view, and a schematic upper side view, respectively, of the semiconductor device of FIG. 1 according to the first embodiment of the present invention.
Figure 2B:
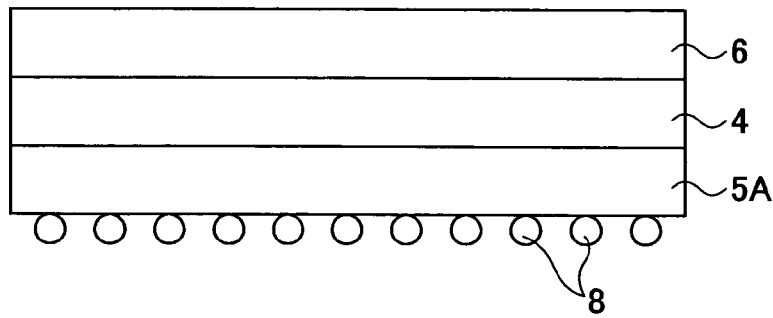
Figure 2C:
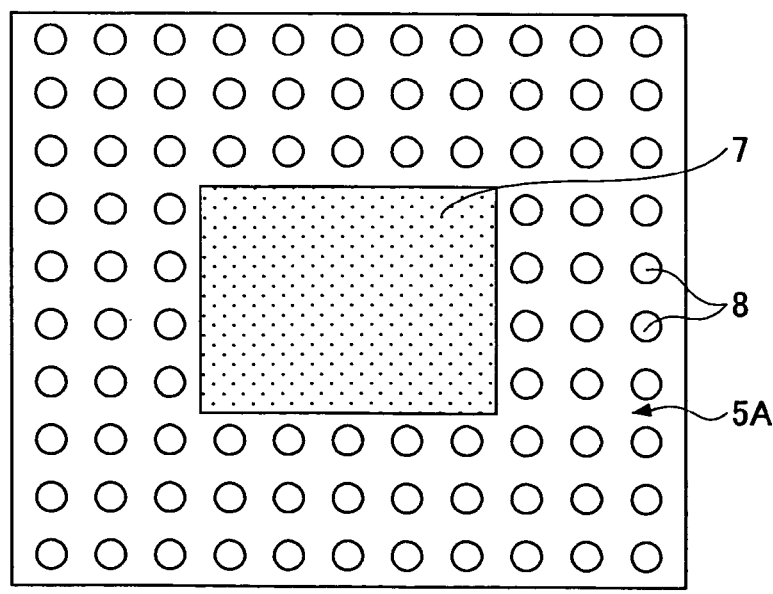

FIGS. 1 and 2A through 2C show a semiconductor device according to a first embodiment of the present invention. FIG. 1 is a cross-sectional view of the semiconductor device, and FIGS. 2A through 2C are a schematic lower side view (top plan view), a schematic front view, and a schematic upper side view (bottom plan view), respectively, of the semiconductor device shown in FIG. 1. Referring to FIGS. 1 and 2A through 2C, the semiconductor device according to the first embodiment includes a semiconductor element 1, a circuit board 4, an interposer 5A, a heat dissipation plate 6, and sealing resin 7.

According to this embodiment, a multilayer interconnection board is employed as the circuit board 4. Therefore, within the circuit board 4, interconnection lines 15 and vias 16 are formed on and/or inside a base material 14 formed of resin. By employing a multilayer interconnection board as the circuit board 4, the interconnections 15 and the vias 16 can be provided with high density and increased design freedom. As a result, the circuit board 4 can be reduced in size, and solder bumps 22 can be provided with narrow pitch.

Solder resist 17 is formed on the upper surface of the circuit board 4. The solder resist 17 is removed so that the interconnection lines 15 formed on the surface of the base material 14 are exposed where wires 12 and the solder bumps 22 are connected thereto. The interconnection lines 15 exposed from the solder resist 17 serve as bonding pads to which the wires 12 are connected or electrode pads to which the solder bumps 22 are connected.

An opening 25 is formed at the substantially center position of the circuit board 4. The opening 25 is formed through the circuit board 4, and is sized so that the semiconductor element 1 is containable therein. The opening 25 is formed by mechanical processing such as punching or routing. Thus, by employing punching or routing, the opening 25 can be formed with ease and accuracy.

The circuit board 4 configured as described above is fixed to the heat dissipation plate 6 using a thermosetting sheet 13. Specifically, with the thermosetting sheet 13 being held between the circuit board 4 and the heat dissipation plate 6, heat is applied to the thermosetting sheet 13 so as to harden the thermosetting sheet 13, thereby joining the circuit board 4 and the heat dissipation plate 6. Accordingly, before the semiconductor element 1 is mounted, the surface of the heat dissipation plate 6 is exposed through the opening 25.

In the interposer 5A, multiple through holes 19 are formed through a base material 18. An upper electrode 20 and a lower electrode 21 are formed on the upper end and the lower end, respectively, of each through hole 19. External connection terminals 8 are connected to the upper electrodes 20, and the solder bumps 22 are provided to the lower electrodes 21. Solder resist 23 is formed on the upper surface of the base material 18 except for the positions where the upper electrodes 20 are formed. Solder resist 24 is formed on the lower surface of the base material 18 except for the positions where the lower electrodes 21 are formed. The interposer 5A is fixed mechanically and connected electrically to the circuit board 4 with solder bumps 22.

The base material 18 forming the interposer 5A is made of resin. According to this embodiment, the coefficient of thermal expansion of the base material 18 is set to a value substantially equal to that of the base material 14 of the circuit board 4. Specifically, the same material is used for the base material 14 forming the circuit board 4 and the base material 18 forming the interposer 5A. As a result, it is possible to prevent stress from being generated between the interposer 5A and the circuit board 4 even if there is a change in environmental temperature. Accordingly, it is possible to prevent fatigue damage from occurring at the joining of the circuit board 4 and the interposer 5A (at the solder bumps 22 in particular), thus allowing the semiconductor device to have increased reliability.

The base material 14 and the base material 18 do not always have to be the same material as long as the coefficient of thermal expansion of the base material 18 can be set to a value substantially equal to that of the base material 14 of the circuit board 4. Employment of different materials for the base materials 14 and 18 increases freedom of material selection, thus making it possible to reduce the costs of the circuit board 4 and the interposer 5A. Further, it is also possible to select materials for the base materials 14 and 18 further in view of the coefficient of thermal expansion of a mounting substrate (not graphically represented) on which the semiconductor device according to the present invention is to be mounted.

In this case, ceramic material may be employed as a specific material for the base material 18. In the case of employing ceramic material, heat generated in the semiconductor element 1 can also be dissipated from the interposer 5A, so that the thermal resistance of the semiconductor device can be reduced. Of ceramic materials, it is desirable to employ low temperature sintering ceramic materials of low sintering temperatures.

An opening 26 is formed at the center position of the interposer 5A. Like the opening 25 formed in the circuit board 4, the opening 26 is formed by mechanical processing such as punching or routing. Accordingly, the opening 26 can also be formed with ease and accuracy.

The opening 26 formed in the interposer 5A is greater in size than the opening 25 formed in the circuit board 4 in order to ensure an area for the wire bonding of the semiconductor element 1 and the circuit board 4 inside the opening 26 as shown in FIG. 1.

With the interposer 5A being joined to the circuit board 4, the thickness (height or vertical dimension in FIG. 1) of the interposer 5A is greater than the height of wire loops formed by the wires 12. That is, the wires 12 are prevented from projecting from the interposer 5A, and are positioned inside the opening 26.

As described above, the external connection terminals 8 are provided to the upper electrodes 20, and the solder bumps 22 are provided to the lower electrodes 21. According to this embodiment, the external connection terminals 8 and the solder bumps 22 are equal in number. Further, when the interposer 5A is seen in two dimensions from its upper or lower side in FIG. 1 (plan view), the positions where the external connection terminals 8 are provided on the interposer 5A coincide with the positions where the lower electrodes 21 connected to the solder bumps 22 are provided. That is, the external connection terminals 8 and the lower electrodes 21 are opposite each other. This configuration makes it possible to simplify the structure and reduce the cost of the interposer 5A.

The semiconductor element 1 is inserted "face-up" into the opening 25 formed in the circuit substrate 4, and is fixed to the heat dissipation plate 6 using a conductive adhesive agent 11. The semiconductor element 1 and the circuit board 4 are connected with the wires 12. As a result, the semiconductor element 1 is electrically connected to the external connection terminals 8 through the circuit board 4 and the interposer 5A. Thus, the wires 12 are employed to electrically join the semiconductor element 1 and the circuit board 4. This eliminates the necessity of providing bumps to the semiconductor element 1 as in flip-chip bonding. Accordingly, the costs of electric connections can be reduced.

The heat dissipation plate 6 is shaped like a flat plate, and copper is employed as its material in this embodiment. Since the heat dissipation plate 6 is shaped like a flat plate of which both surfaces are flat, no press working for forming a recess, etching, or bending is necessary and only cutting is required as processing in manufacturing the heat dissipation plate 6. Therefore, costs can be reduced. A surface treatment film 27 is formed on the outer surface (lower surface in FIG. 1) of the heat dissipation plate 6 in order to prevent a change in the quality of the heat dissipation plate 6.

In order to dissipate heat generated in the semiconductor element 1 satisfactorily, it is desirable that the material of the heat dissipation plate 6 be higher than or equal to 100 W/m/K and lower than or equal to 3000 W/m/K in thermal conductivity. Specifically, of metals other than copper, nickel and aluminum may be employed in this embodiment. Further, of materials other than metal, ceramic materials may be employed. Some ceramic materials have coefficients of thermal expansion close to that of the semiconductor element 1. Accordingly, in the case of employing such ceramic materials, a highly reliable semiconductor device can be realized.

Further, a carboniferous substance containing carbon as its principal component may be employed as the material of the heat dissipation plate 6. By employing a carboniferous substance, the heat dissipation plate 6 can be extremely reduced in thermal resistance, so that heat dissipation efficiency can be further increased. Specific examples of carboniferous substances include diamond and carbon nanotubes.

In this embodiment, the heat dissipation plate 6 is shaped like a flat plate of which both surfaces are flat. However, both surfaces of a heat dissipation member do not always have to be flat in shape. At least one of the surfaces to which one the semiconductor element 1 is joined should be flat. For instance, the heat dissipation plate 6 may have a fin shape. In this case, its heat dissipation characteristics can be improved.

The sealing resin 7 is formed inside the opening 25 formed in the circuit board 4 and the opening 26 formed in the interposer 5A. As a result, the semiconductor element 1 provided in the opening 25 and the wires 12 provided in the opening 26 are protected by the sealing resin 7.

The external connection terminals 8 are provided to the upper electrodes 20 formed on the interposer 5A as described above. At this point, as shown in FIG. 2C, the external connection terminals 8 are provided in a matrix-like manner so as to surround the sealing resin 7 filling the opening 26 in the interposer 5A. Therefore, according to the semiconductor device according to this embodiment, the openings 25 and 26 are formed in the circuit board 4 and the interposer 5A, respectively, and the semiconductor element 1 is thermally coupled directly to the surface of the heat dissipation plate 6 exposed in the openings 25 and 26. According to this configuration, although the semiconductor device contains the circuit board 4 and the interposer 5A, low heat resistance can be obtained with respect to heat generation by thermally coupling the semiconductor element 1 directly to the heat generation plate 6. As a result, heat generated in the semiconductor element 1 can be dissipated with efficiency.

Further, no press working is performed on the semiconductor device according to this embodiment, in which the heat dissipation plate 6 is shaped like a flat plate. The loop height of the wires 12 is set to be smaller than the thickness of the interposer 5A, so that the wires 12 are positioned inside the opening 26. Accordingly, as shown in FIGS. 1 and 2B, the surface of the sealing resin 7 is in the same plane as the surface of the interposer 5A, and is prevented from projecting therefrom.

Therefore, the loop height of the wires 12 and the ball size of the external connection terminals 8 (solder balls) can be set as desired without mutual interference. Accordingly, the semiconductor device according to the present invention can be reduced in cost, higher in reliability, narrower in pitch, and reduced in size.

Further, according to this embodiment, as shown in FIGS. 2A through 2C, the circuit board 4, the interposer 5A, and the heat dissipation plate 6 have the same shape (outer form). This facilitates the handling of the semiconductor device in, for instance, carrying the semiconductor device. Further, this makes it difficult for an unnecessary external force to be applied to the semiconductor device, so that the reliability of the semiconductor device can be increased.

Next, a description is given of second through 20$^{th}$ embodiments according to the present invention. FIGS. 3 through 21 show semiconductor devices according to the second through 20$^{th}$ embodiments, respectively. In FIGS. 3 through 21, the same elements as those of FIGS. 1 and 2A through 2C are referred to by the same numerals, and a description thereof is omitted.

Each of the semiconductor devices according to the second through sixth embodiments shown in FIGS. 3 through 7, respectively, has multiple semiconductor elements provided therein. Thus, by incorporating multiple semiconductor elements, it is possible to cause the semiconductor elements to function as an SiP (System in Package), so that the semiconductor devices can be sophisticated and the freedom of designing electric circuits can be improved. Like the semiconductor element 1 in the semiconductor device of the first embodiment, multiple semiconductor elements are thermally coupled directly to the heat dissipation plate 6 in each of the semiconductor devices of the second through sixth embodiments. Accordingly, even when the provision of multiple semiconductor elements increases the overall heat generated in the semiconductor devices, the dissipation of the heat can be ensured. A description is given below of each embodiment.

Figure 3:
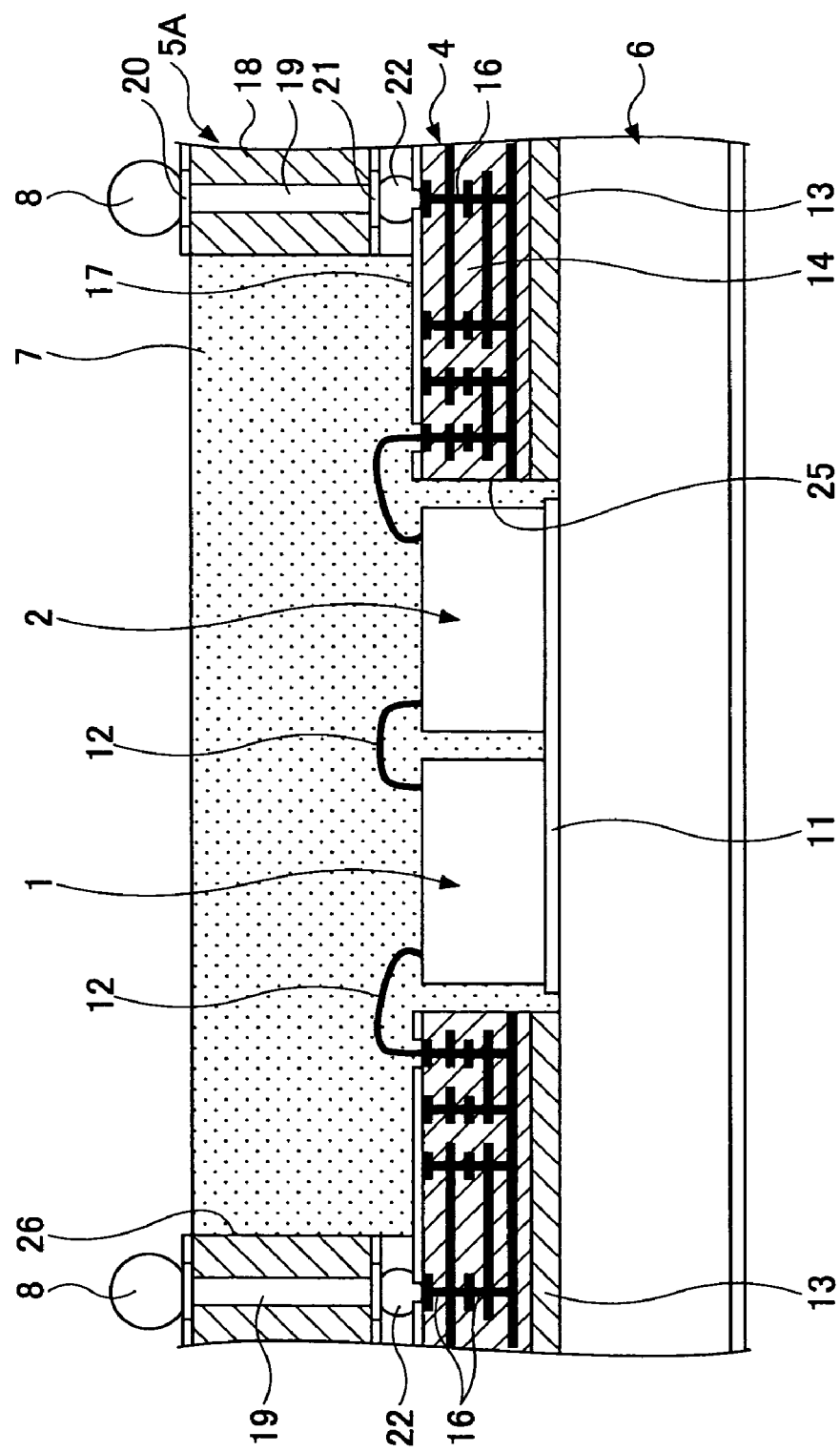
FIG. 3 is a cross-sectional view of part of a semiconductor device according to a second embodiment of the present invention.

In the semiconductor device according to the second embodiment shown in FIG. 3, the semiconductor element 1 and a semiconductor element 2 are provided side by side in the opening 25. The connection between the semiconductor elements 1 and 2 and the circuit board 4 and the connection between the semiconductor elements 1 and 2 are established with the wires 12. According to the configuration of this embodiment, since the semiconductor elements 1 and 2 are provided side by side, the semiconductor device can be reduced in thickness.

Figure 4:
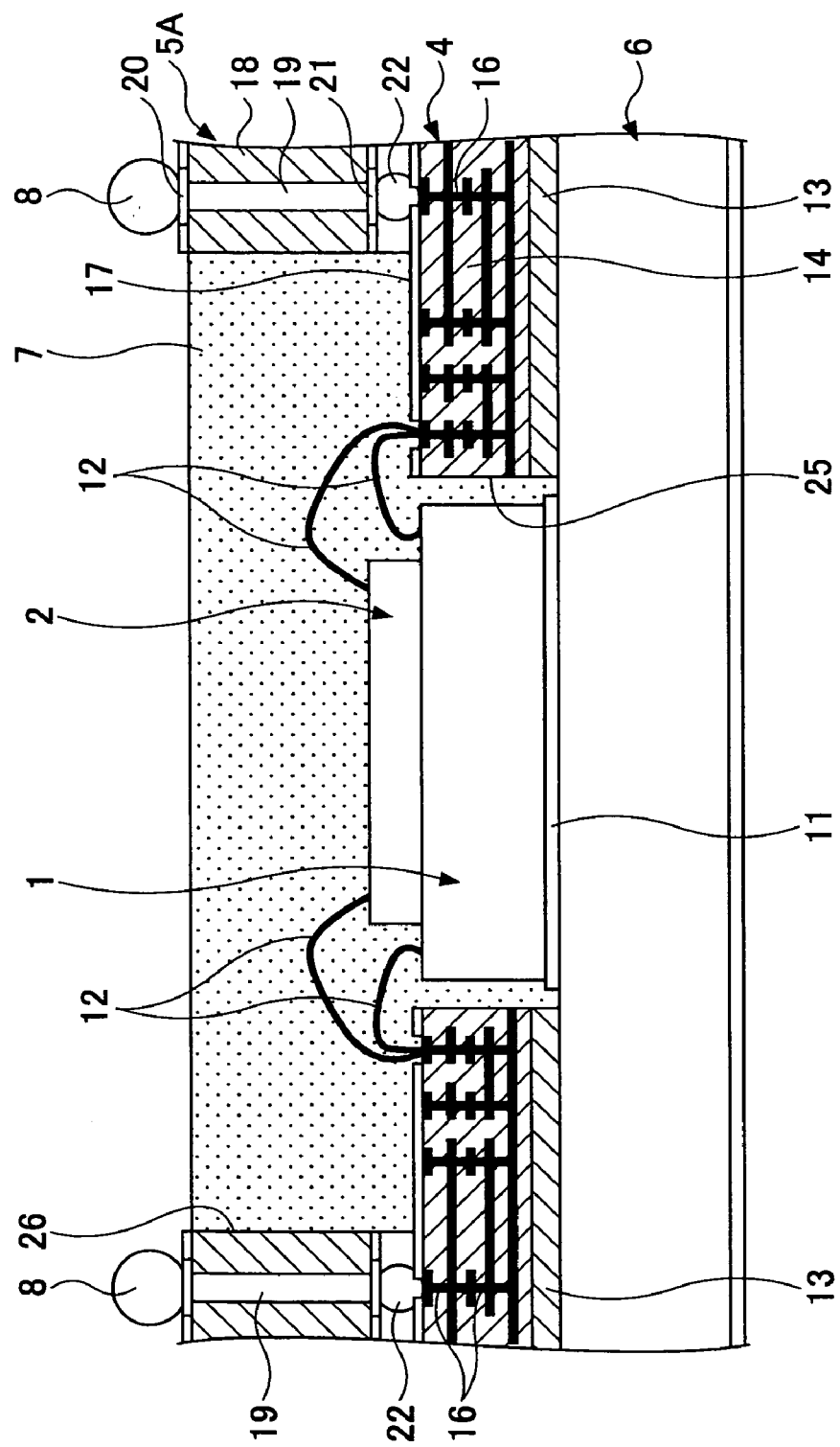
FIG. 4 is a cross-sectional view of part of a semiconductor device according to a third embodiment of the present invention.

In the semiconductor device according to the third embodiment shown in FIG. 4, the semiconductor element 1 is mounted inside the opening 25, and the semiconductor element 2 is stacked on the semiconductor element 1. According to this embodiment, the semiconductor elements 1 and 2 are also connected to the circuit board 4 with the wires 12. According to the configuration of this embodiment, since the semiconductor elements 1 and 2 are stacked, the semiconductor device can be reduced in area when the semiconductor device is viewed in plan view.

Figure 5:
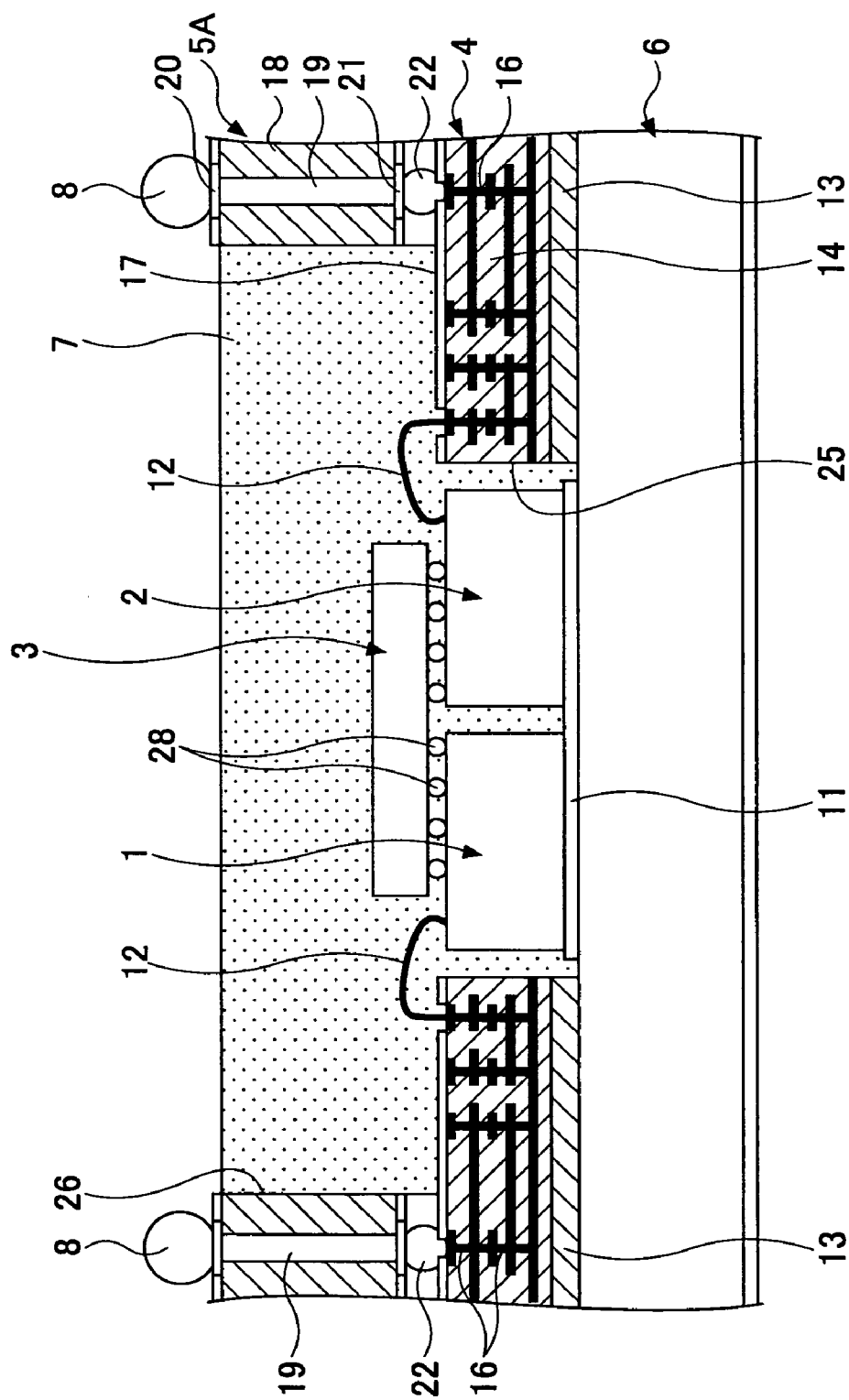
FIG. 5 is a cross-sectional view of part of a semiconductor device according to a fourth embodiment of the present invention.

In the semiconductor device according to the fourth embodiment shown in FIG. 5, the semiconductor elements 1 and 2 and a semiconductor element 3 are provided. The semiconductor elements 1 and 2 are provided side by side in the opening 25. The semiconductor element 3 is stacked on the semiconductor elements 1 and 2 so as to straddle the semiconductor elements 1 and 2. The semiconductor elements 1 and 2 are connected to the circuit board 4 with the wires 12. The semiconductor element 3 is connected to the semiconductor elements 1 and 2 by flip-chip bonding with bumps 28. This configuration enables the semiconductor device to be further sophisticated.

Figure 6:
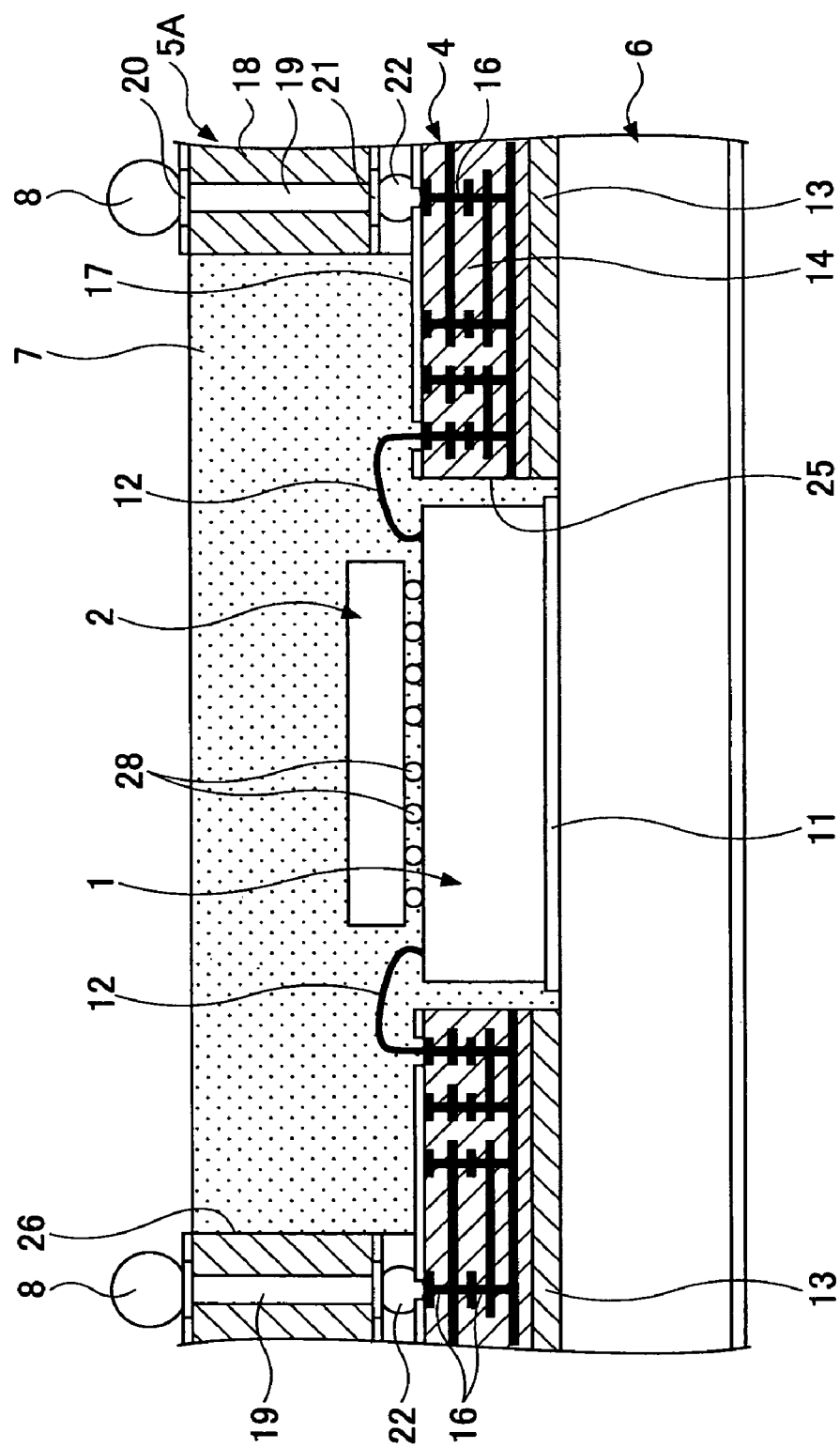
FIG. 6 is a cross-sectional view of part of a semiconductor device according to a fifth embodiment of the present invention.

In the semiconductor device according to the firth embodiment shown in FIG. 6, the semiconductor element 2 is stacked on the semiconductor element 1. According to this embodiment, the semiconductor element 1 and the circuit board 4 are connected with the wires 12, and the semiconductor element 2 and the semiconductor element 1 are connected by flip-chip bonding using the bumps 28.

Figure 7:
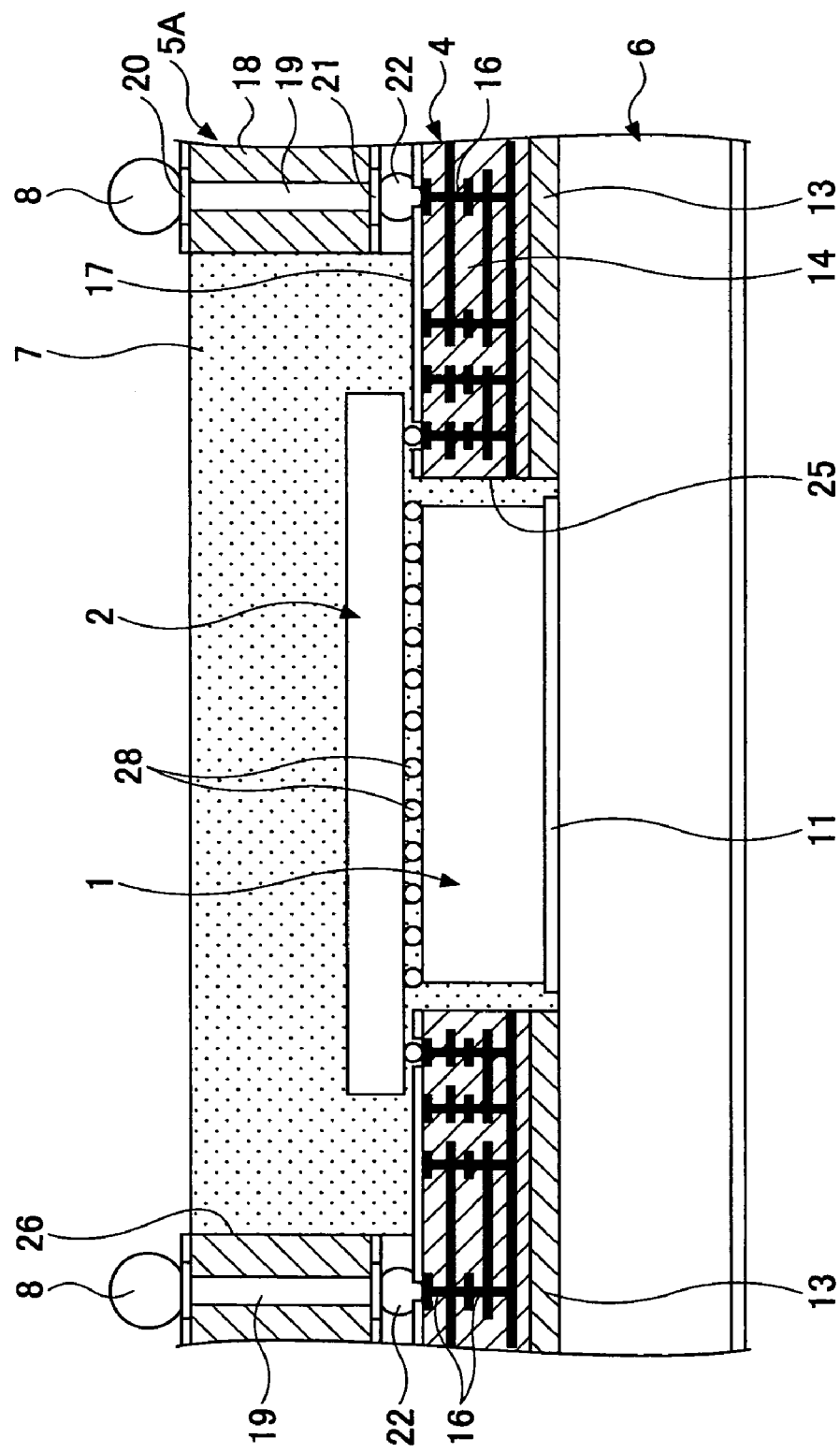
FIG. 7 is a cross-sectional view of part of a semiconductor device according to a sixth embodiment of the present invention.

In the semiconductor device according to the sixth embodiment shown in FIG. 7, the semiconductor element 2 is stacked on the semiconductor element 1. According to this embodiment, the semiconductor element 2 is shaped to be greater in size than the semiconductor element 1. Specifically, the semiconductor element 2 is shaped to be greater in size than the opening 25 formed in the circuit board 4. Accordingly, with the semiconductor element 2 being stacked on the semiconductor element 1, the semiconductor element 2 overlaps with the circuit board 4 so that the edge part of the semiconductor element 2 is over the circuit board 4.

The bumps 28 are also provided to the overlap between the semiconductor element 2 and the circuit board 4. Accordingly, the semiconductor element 2 is connected to both the semiconductor element 1 and the circuit board 4 by flip-chip bonding. According to this embodiment, the semiconductor element 1 and the circuit board 4 are connected via the semiconductor element 2.

Figure 8:
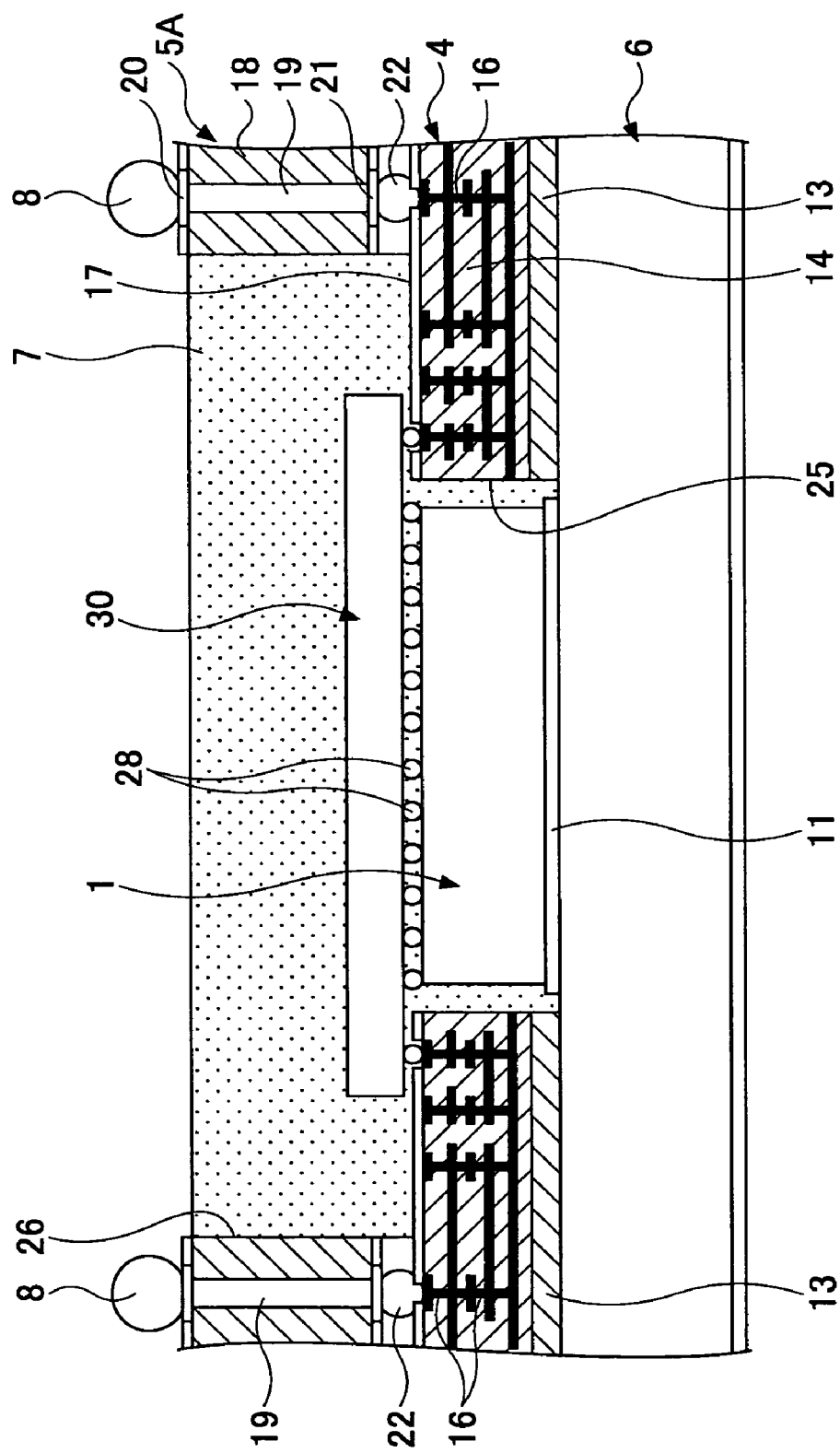
FIG. 8 is a cross-sectional view of part of a semiconductor device according to a seventh embodiment of the present invention.
Figure 9:
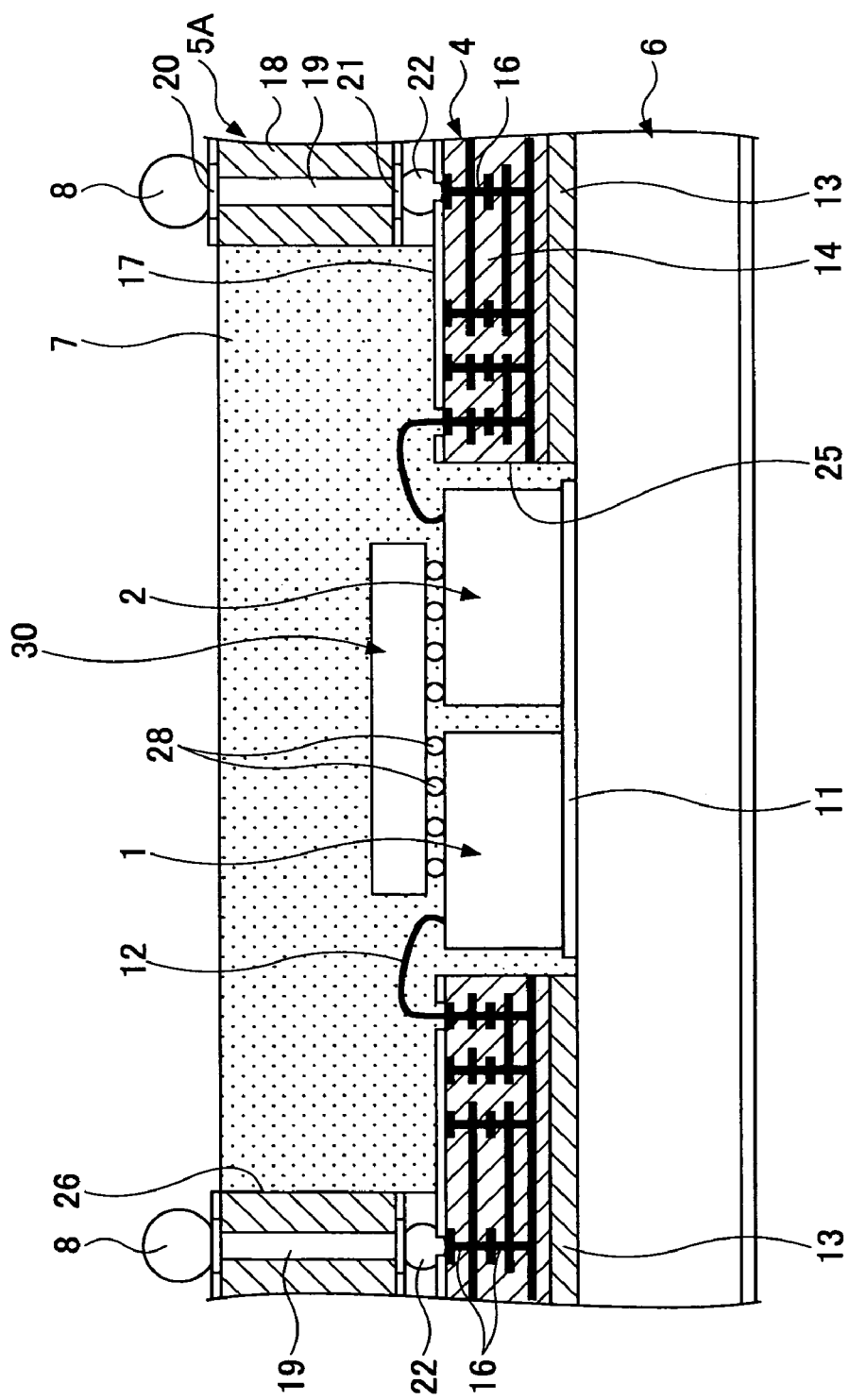
FIG. 9 is a cross-sectional view of part of a semiconductor device according to an eighth embodiment of the present invention.

In the semiconductor devices shown in FIGS. 8 and 9, an electric circuit board 30 is employed to connect the semiconductor element 1 and the circuit board 4 (FIG. 8) or to connect the semiconductor elements 1 and 2 (FIG. 9).

In the semiconductor device according to the seventh embodiment shown in FIG. 8, the electric circuit board 30 is stacked on the semiconductor element 1. The electric circuit board 30, which is a circuit board such as a printed circuit board or a ceramic circuit board, may be a double-sided board or a multilayer board.

According to this embodiment, the electric circuit board 30 is shaped to be greater in size than the semiconductor element 1. Specifically, the electric circuit board 30 is shaped to be greater in size than the opening 25 formed in the circuit board 4.

Accordingly, with the electric circuit board 30 being stacked on the semiconductor element 1, the electric circuit board 30 overlaps with the circuit board 4 so that the edge part of the electric circuit board 30 is over the circuit board 4. The bumps 28 are also provided to the overlap between the electric circuit board 30 and the circuit board 4. Accordingly, the electric circuit board 30 is connected to both the semiconductor element 1 and the circuit board 4 by flip-chip bonding. According to this embodiment, the semiconductor element 1 and the circuit board 4 are connected via the electric circuit board 30.

In the semiconductor device according to the eighth embodiment shown in FIG. 9, the semiconductor elements 1 and 2 are provided side by side in the opening 25. The electric circuit board 30 is stacked on the semiconductor elements 1 and 2 so as to straddle the semiconductor elements 1 and 2. The semiconductor elements 1 and 2 are connected to the circuit board 4 with the wires 12. The electric circuit board 30 is connected to the semiconductor elements 1 and 2 by flip-chip bonding with the bumps 28. Thus, the electric connection between the semiconductor elements 1 and 2 may be established not only with the wires 12 but also with the electric circuit board 30.

In the case of employing the electric circuit board 30, it is possible to provide interconnection lines on the electric circuit board 30. Accordingly, freedom of connections can be improved. Further, the interconnection lines formed on the electric circuit board 30 can be lower in impedance than the wires 12. Accordingly, an increase in the operating speed of the semiconductor elements 1 and 2 can be supported.

Figure 10:
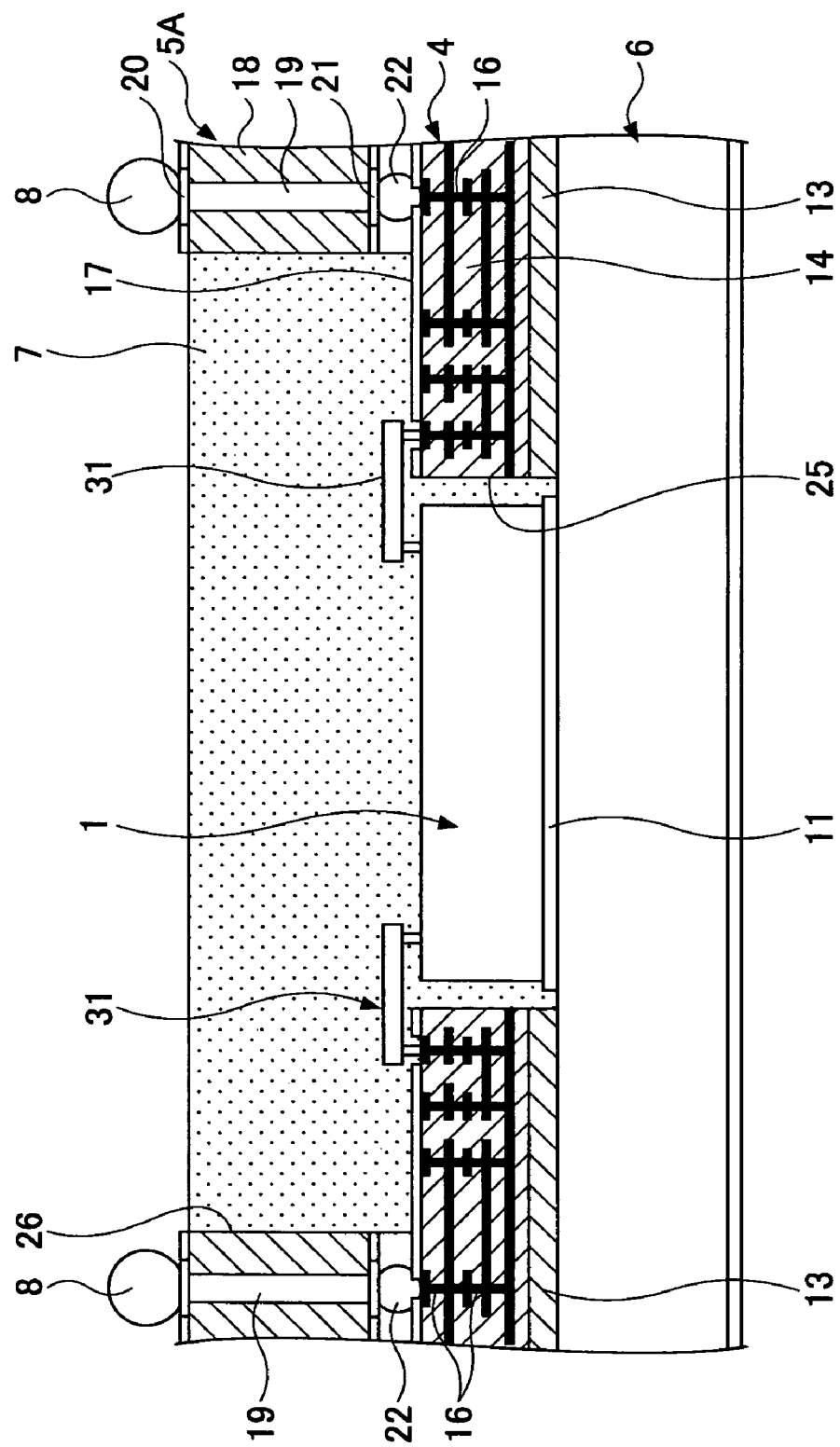
FIG. 10 is a cross-sectional view of part of a semiconductor device according to a ninth embodiment of the present invention.

FIG. 10 shows the semiconductor device according to the ninth embodiment of the present invention. In the semiconductor device according to this embodiment, the semiconductor element 1 and the circuit board 4 are connected with a TAB (Tape Automated Bonding) tape 31.

The TAB tape 31 has a wiring pattern of conductive material formed on a resin insulating film. By joining the wiring pattern formed on the TAB tape 31, the semiconductor element 1 and the circuit board 4 are electrically connected. The TAB tape 31 enables the miniaturization of a wiring pattern. Accordingly, the TAP tape 31 can support the miniaturization of the electrodes of the semiconductor element 1 and the electrode pads of the circuit board 4 to which the TAP tape 31 is connected. Accordingly, the TAP tape 31 can support an increase in the density of the semiconductor element 1 and the circuit board 4.

Figure 11:
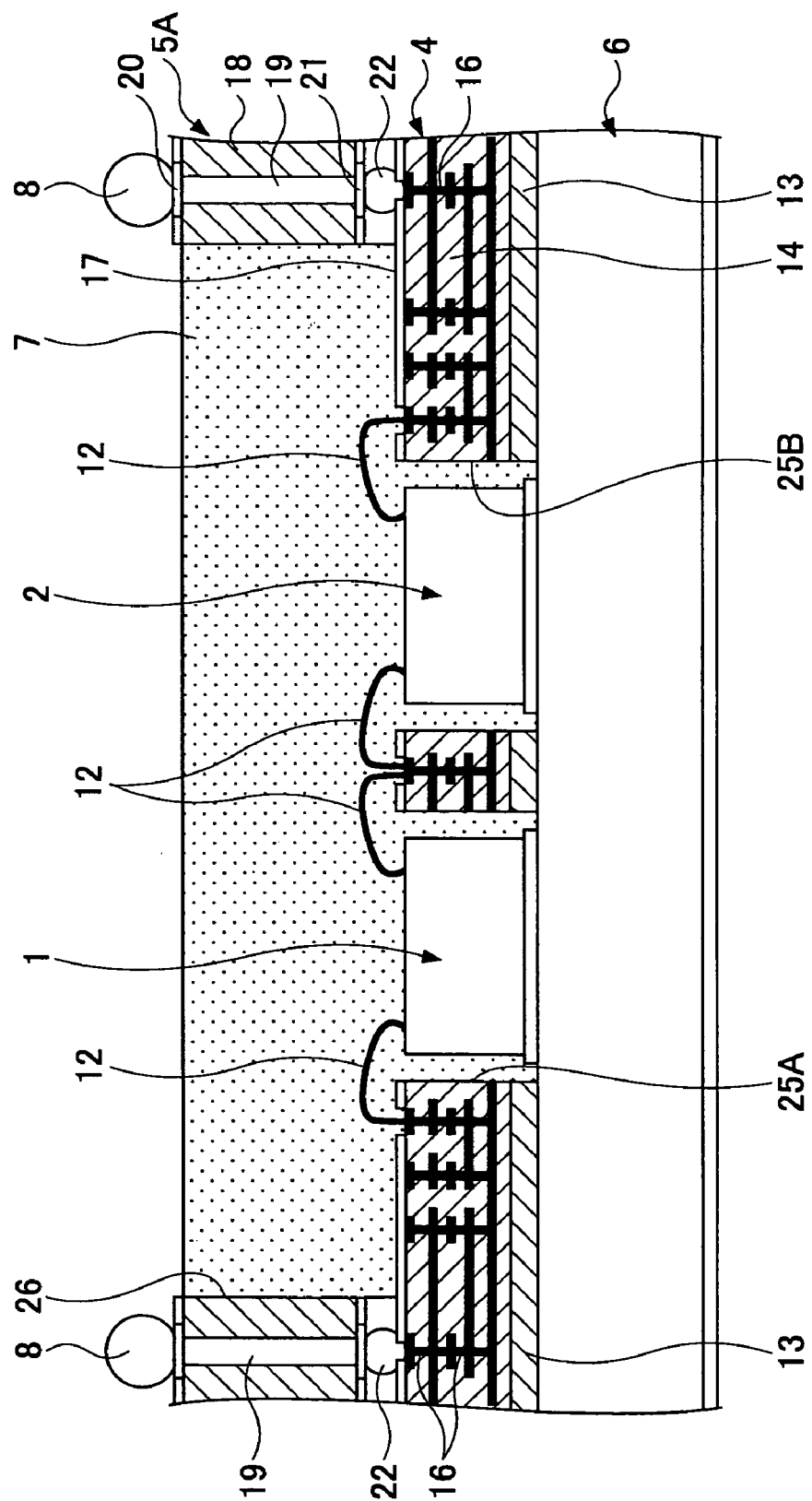
FIG. 11 is a cross-sectional view of part of a semiconductor device according to a tenth embodiment of the present invention.

FIG. 11 shows the semiconductor device according to the tenth embodiment of the present invention. In the semiconductor device according to this embodiment, multiple (two in this embodiment) openings 25A and 25B are formed in the circuit board 4, and the semiconductor elements 1 and 2 are provided in the openings 25A and 25B, respectively.

Like the above-described opening 25, the openings 25A and 25B are also formed by punching or routing. Since the openings 25A and 25B are formed through the circuit board 4, the heat dissipation plate 6 is exposed from each of the openings 25A and 25B with the circuit board 4 being provided on the heat dissipation plate 6. Accordingly, the semiconductor elements 1 and 2 are also thermally coupled directly to the heat dissipation plate 6 in this embodiment.

In the semiconductor device according to this embodiment, the openings 25A and 25B corresponding to the semiconductor elements 1 and 2, respectively, are formed. Accordingly, it is possible to identify the semiconductor elements 1 and 2 based on the shapes of the openings 25A and 25B at the time of mounting the semiconductor elements 1 and 2. This facilitates the attachment of the semiconductor elements 1 and 2 to the openings 25A and 25B, respectively. Further, at the time of connecting the semiconductor elements 1 and 2 with the interposer 5A or the circuit board 4, wiring length required for the connection can be reduced, so that impedance can be reduced. This enables the semiconductor device to have better electrical characteristics, especially, higher operating speed.

Figure 12:
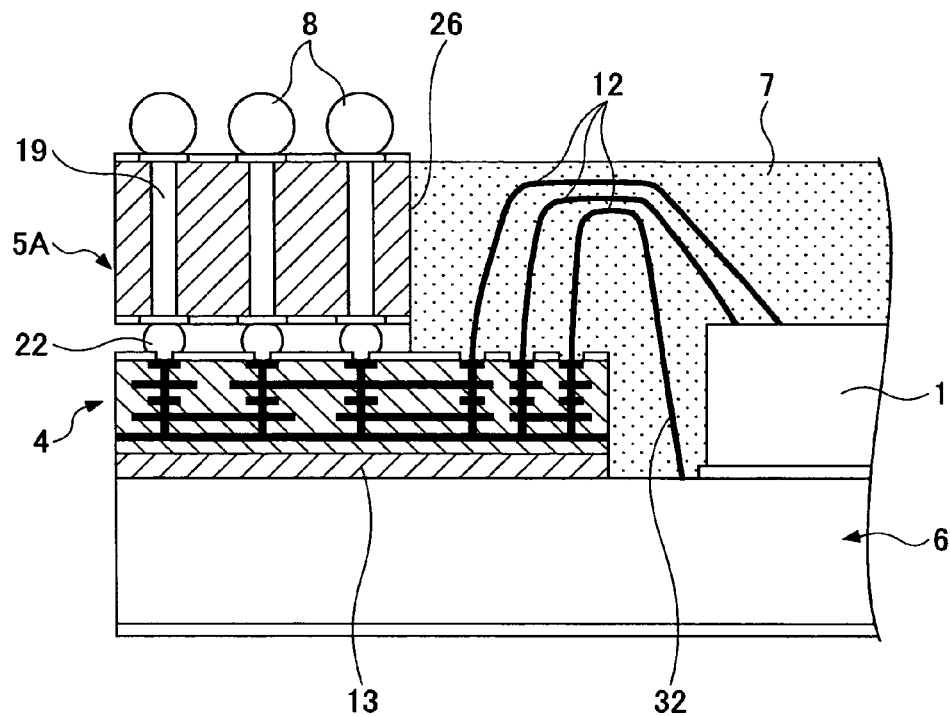
FIG. 12 is a cross-sectional view of part of a semiconductor device according to an $11^{th}$ embodiment of the present invention.

FIG. 12 shows the semiconductor device according to the 11$^{th}$ embodiment of the present invention. In the semiconductor device according to this embodiment, a heat dissipation plate connection wire 32 is provided between a ground pad formed on the circuit board 4 and the heat dissipation plate 6.

As described above, the heat dissipation plate 6 is made of copper, which is a conductive material. Accordingly, the heat dissipation plate 6 and the ground interconnection line of the circuit board 4 are electrically connected by providing the heat dissipation plate connection wire 32. The heat dissipation plate connection wire 32 may be formed simultaneously with the wire bonding of the wires 12.

According to the semiconductor device of this embodiment, the heat dissipation plate 6 is connected to the ground line of the circuit board 4 so as to be grounded. As a result, the heat dissipation plate 6 has the function of shielding as well as the function of heat dissipation. Accordingly, it is possible to prevent external noise from affecting the semiconductor element 1, so that a highly reliable semiconductor device that is tolerant of external noise can be realized. Further, compared with a configuration in which a shield plate is provided separately, it is possible to reduce the number of components, the size, and the cost of the semiconductor device. In the above-described 11$^{th}$ embodiment, the heat dissipation plate 6 is connected to the ground line of the circuit board 4. However, it is also possible to connect the heat dissipation plate 6 to a power supply line.

Figure 13:
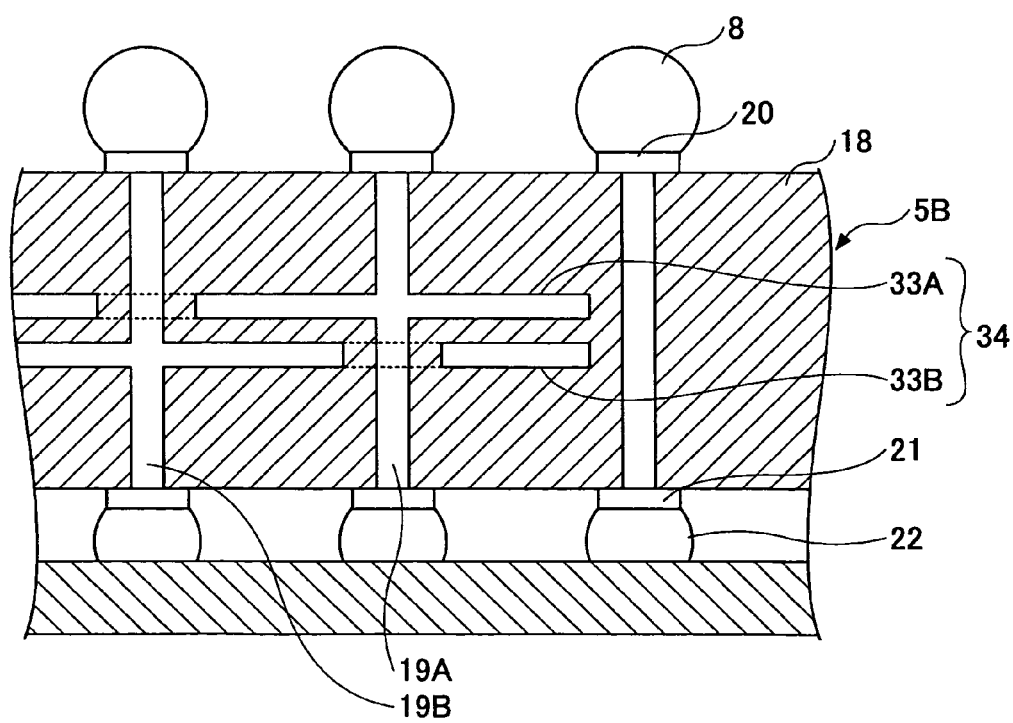
FIG. 13 is a cross-sectional view of part of a semiconductor device according to a $12^{th}$ embodiment of the present invention.

FIG. 13 shows the semiconductor device according to the 12$^{th}$ embodiment of the present invention. In FIG. 13, for convenience of description, part of the interposer 5A of the semiconductor device is shown enlarged and the graphical representation of the other part is omitted. The same holds true for FIGS. 14 through 17 for illustrating the below-described 13$^{th}$ to 16$^{th}$ embodiments. Further, in FIGS. 13 through 17, the graphical representation of the solder resists 23 and 24 is omitted.

In the semiconductor device according to the 12$^{th}$ embodiment, a passive element is provided in an interposer 5B. Specifically, a decoupling capacitor 34 is formed inside the interposer 5B in this embodiment. The decoupling capacitor 34 includes a plate part 33A connected to a through hole 19A and a plate part 33B connected to a through hole 19B. A material having a high dielectric constant is selected as the base material 18.

According to this embodiment, the decoupling capacitor 34 is provided inside the interposer 5B. As a result, it is possible to reduce power supply noise, and accordingly, increase the reliability of the semiconductor device. Compared with a configuration in which a decoupling capacitor is provided as a separate component, the semiconductor device can be reduced in size, and the decoupling capacitor 34 can be positioned closer to the semiconductor element 1. As a result, efficient noise reduction can be performed.

According to this embodiment, the decoupling capacitor 34 is provided as a passive element. However, not only a capacitor, but also a resistor, a coil, or an antenna may be provided in the interposer 5B as a passive element. This enables the semiconductor device to be sophisticated and have more functions.

Figure 14:
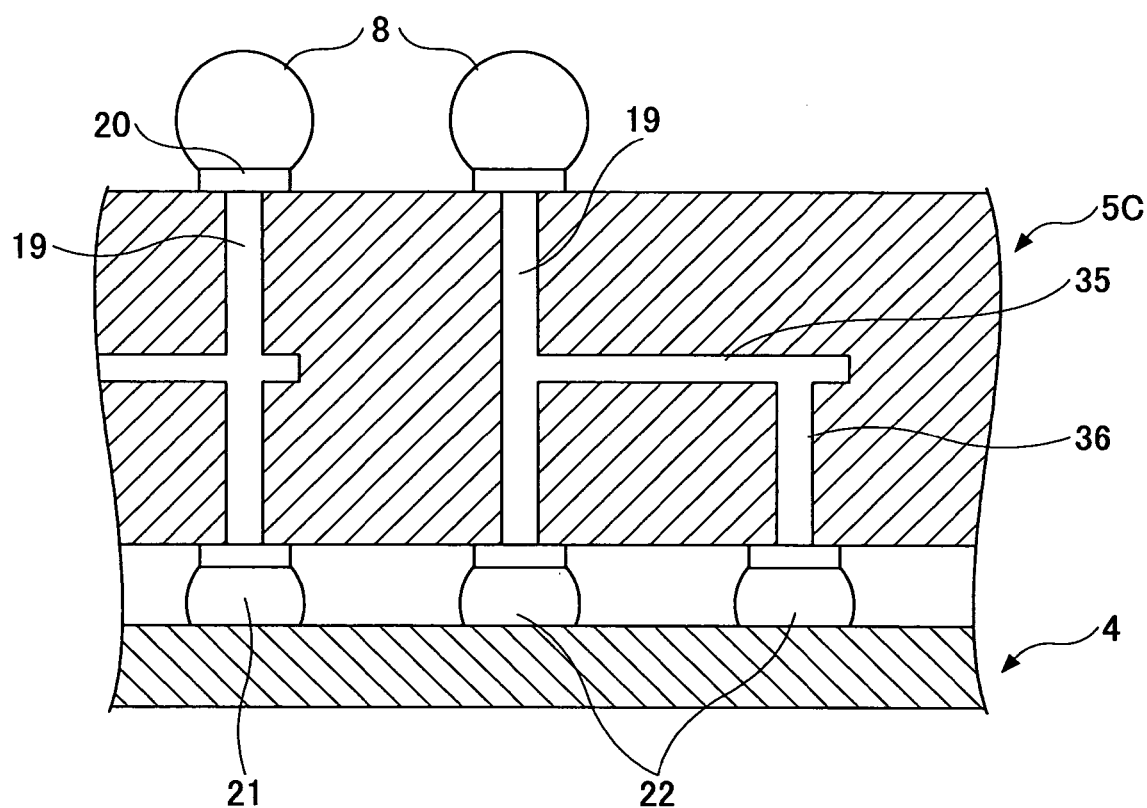
FIG. 14 is a cross-sectional view of part of a semiconductor device according to a $13^{th}$ embodiment of the present invention.
Figure 15:
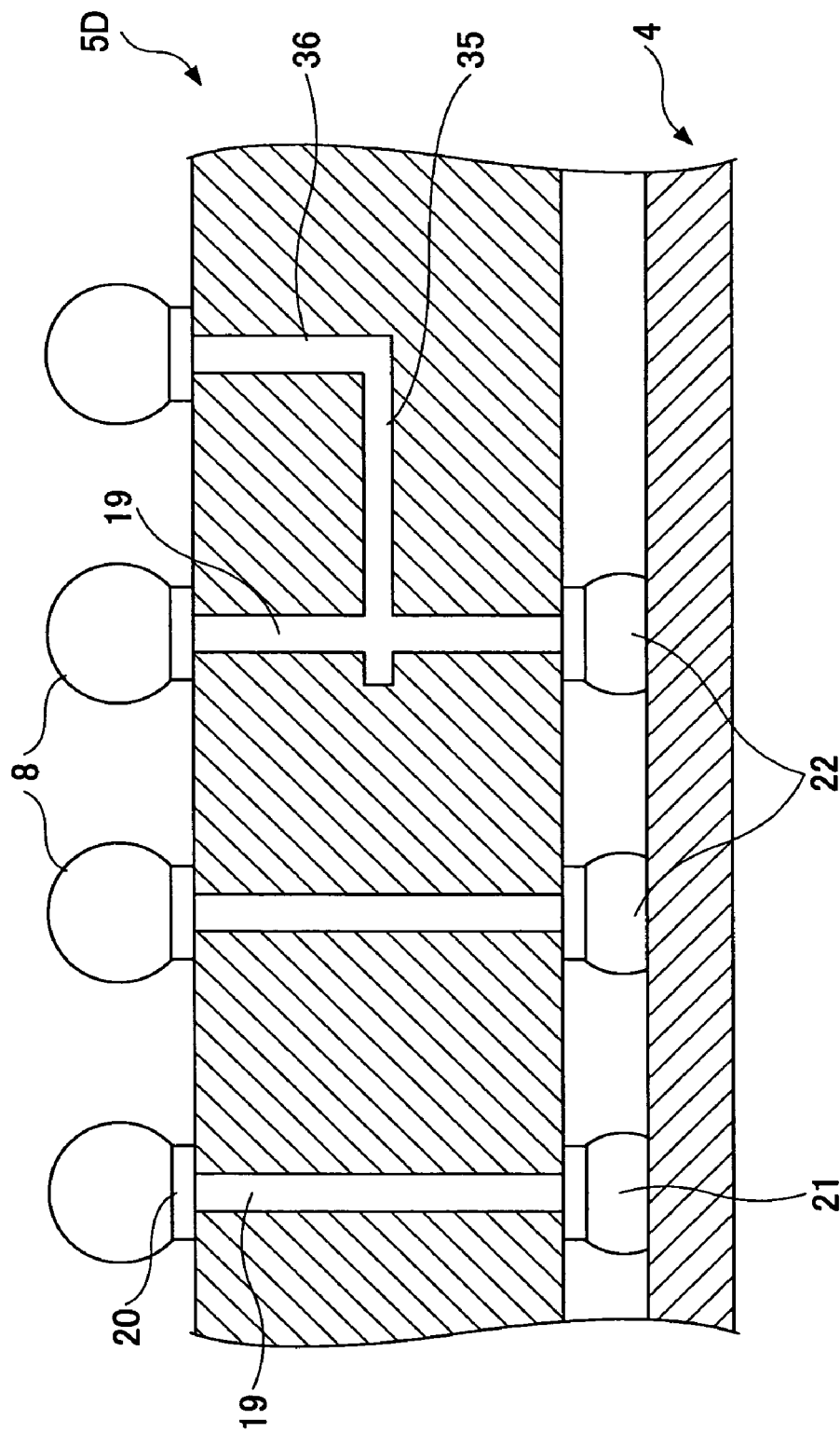
FIG. 15 is a cross-sectional view of part of a semiconductor device according to a $14^{th}$ embodiment of the present invention.

FIGS. 14 and 15 show the semiconductor devices according to the 13$^{th}$ and 14$^{th}$ embodiments, respectively. In the semiconductor devices according to the 13$^{th}$ and 14$^{th}$ embodiments, the upper electrodes 20 and the lower electrodes 21 provided on interposers 5C and 5D are different in number. As a result, in each of the interposers 5C and 5D, the external connection terminals 8 provided to the upper electrodes 20 provided on the upper surface and the solder bumps 22 provided to the lower electrodes 21 provided on the lower surface are different in number.

Specifically, in the semiconductor device shown in FIG. 14, an internal layer interconnection line 35 and a via 36 are connected to the corresponding through hole 19 so that the upper electrodes 20 (the external connection terminals 8) provided on the upper surface of the interposer 5C are less in number than the lower electrodes 21 (the solder bumps 22) provided on the lower surface of the interposer 5C.

On the other hand, in the semiconductor device shown in FIG. 15, the internal layer interconnection line 35 and the via 36 are connected to the corresponding through hole 19 so that the upper electrodes 20 (the external connection terminals 8) provided on the upper surface of the interposer 5D are more in number than the lower electrodes 21 (the solder bumps 22) provided on the lower surface of the interposer 5D. Thus, the number of external connection terminals 8 and the number of solder bumps 22 do not always have to be equal, and may be changed suitably in accordance with the wiring configuration of the circuit board 4 and/or the terminal layout of the external connection terminals 8.

Figure 16:
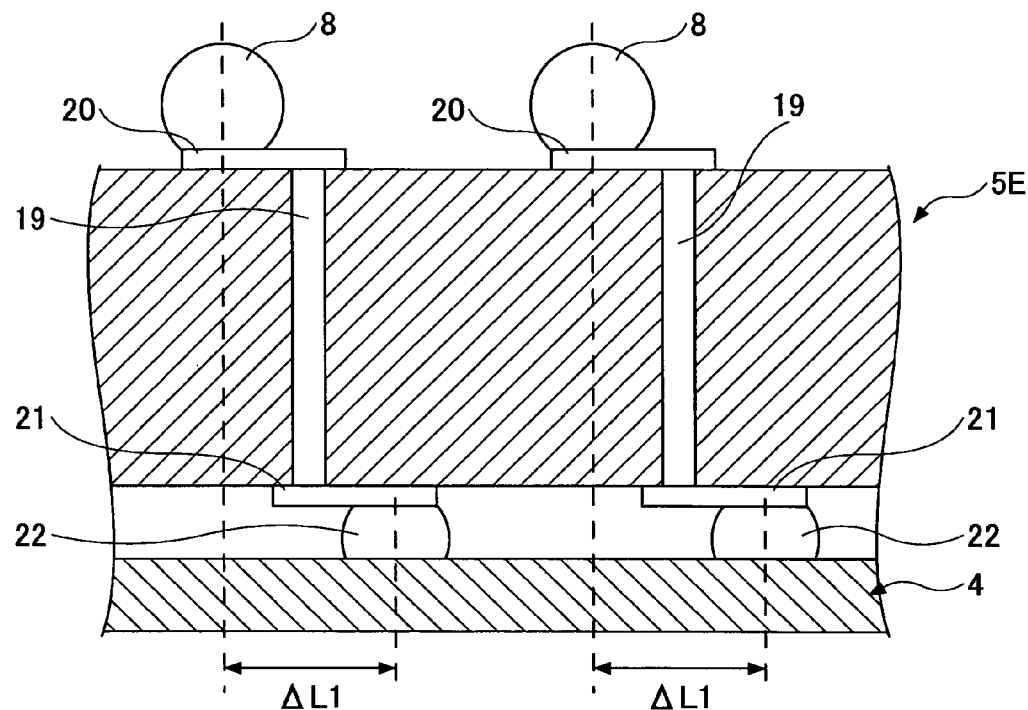
FIG. 16 is a cross-sectional view of part of a semiconductor device according to a $15^{th}$ embodiment of the present invention.
Figure 17:
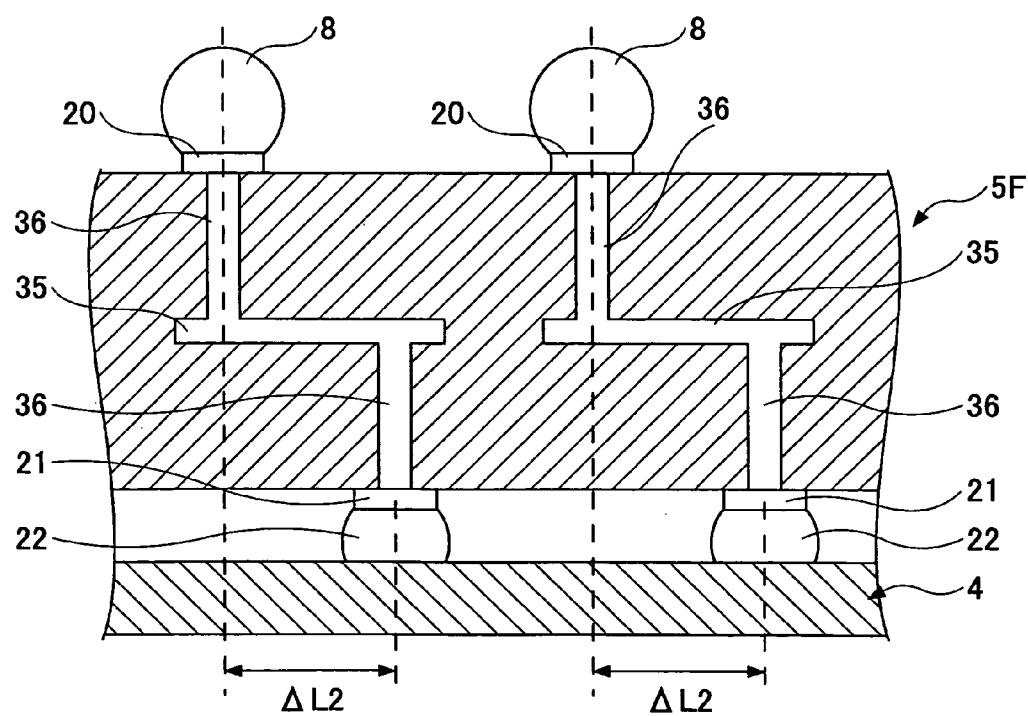
FIG. 17 is a cross-sectional view of part of a semiconductor device according to a $16^{th}$ embodiment of the present invention.

FIGS. 16 and 17 show the semiconductor devices according to the $15^{th}$ and $16^{th}$ embodiments of the present invention. In the semiconductor devices according to the $15^{th}$ and $16^{th}$ embodiments, the positions where the external connection terminals 8 are provided on interposers 5E and 5F are different from the positions where the solder bumps 22 for connection to the circuit board 4 are provided on the interposers 5E and 5F when the interposers 5E and 5F are viewed two-dimensionally from their upper or lower side in FIGS. 16 and 17, respectively.

Specifically, in the semiconductor device according to the $15^{th}$ embodiment shown in FIG. 16, the upper electrodes 20 and the lower electrodes 21 are enlarged so that the external connection terminals 8 and the solder bumps 22 are offset from their respective positions where the external connection terminals 8 and the solder bumps 22 are opposite each other (the positions in the first embodiment shown in FIG. 1). In the case of FIG. 16, the external connection terminals 8 and the corresponding solder bumps 22 are laterally offset from each other by a dimension indicated by arrow $\Delta L1$ in FIG. 16. This configuration is equivalent to a configuration where the positions of the external connection terminals 8 do not coincide with (or are different from) the positions of the corresponding solder bumps 22 when the interposer 5E is viewed two-dimensionally from its upper or lower side in FIG. 16.

On the other hand, in the semiconductor device according to the $16^{th}$ embodiment shown in FIG. 17, the positions of the (upper) vias 36 connected to the upper electrodes 20 (the external connection terminals 8) and the positions of the (lower) vias 36 connected to the lower electrodes 21 (the solder bumps 22) are offset from each other, and the corresponding upper and lower vias 36 are connected with the internal layer interconnection lines 35. Thereby, the external connection terminals 8 and the solder bumps 22 are offset from their respective positions where the external connection terminals 8 and the solder bumps 22 are opposite each other. In the case of FIG. 17, the external connection terminals 8 and the corresponding solder bumps 22 are laterally offset from each other by a dimension indicated by arrow $\Delta L2$ in FIG. 17. This configuration is also equivalent to the configuration where the positions of the external connection terminals 8 do not coincide with (or are different from) the positions of the corresponding solder bumps 22 when the interposer 5F is viewed two-dimensionally from its upper or lower side in FIG. 17.

According to each of the semiconductor devices of the $15^{th}$ and $16^{th}$ embodiments, it is possible to change the terminal pitch of the external connection terminals 8 and the terminal pitch of the solder bumps 22. As a result, freedom of terminal layout can be improved.

Figure 18:
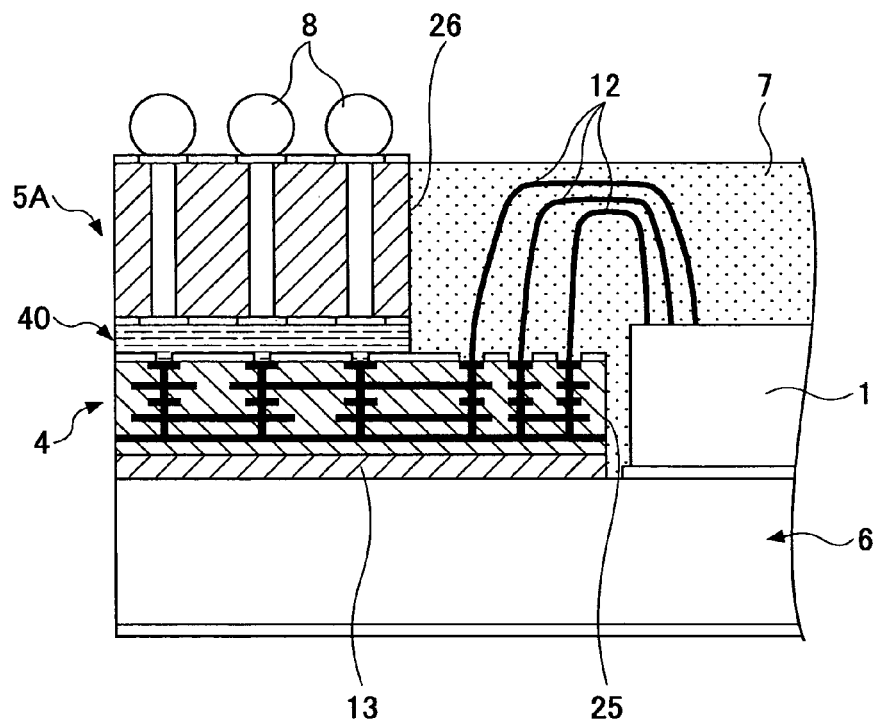
FIG. 18 is a cross-sectional view of part of a semiconductor device according to a $17^{th}$ embodiment of the present invention.

FIG. 18 shows the semiconductor device according to the $17^{th}$ embodiment of the present invention. In the semiconductor device according to this embodiment, the circuit board 4 and the interposer 5A are electrically connected using an anisotropic conductive member 40. The anisotropic conductive member 40 has conductive particles mixed in an insulating film. The anisotropic conductive member 40 has the function of enabling electric conduction in a direction in which the anisotropic conductive member 40 is pressed into contact only at the part of the press contact thereof.

According to the semiconductor device of this embodiment, the anisotropic conductive member 40 comes into close contact with the circuit board 4 and the interposer 5A so that no space is formed between the circuit board 4 and the interposer 5A. Accordingly, even when there is a change in temperature, the occurrence of a problem due to the expansion of a space can be prevented. As a result, a highly reliable semiconductor device can be realized.

In the case of connecting the circuit board 4 and the interposer 5A with the solder bumps 22, the interposer 5A is caused to vary in height when the solder bumps 22 are melted. However, in the case of employing the anisotropic conductive member 40, this variation in height is prevented from occurring. This also increases the reliability of the semiconductor device.

Figure 19:
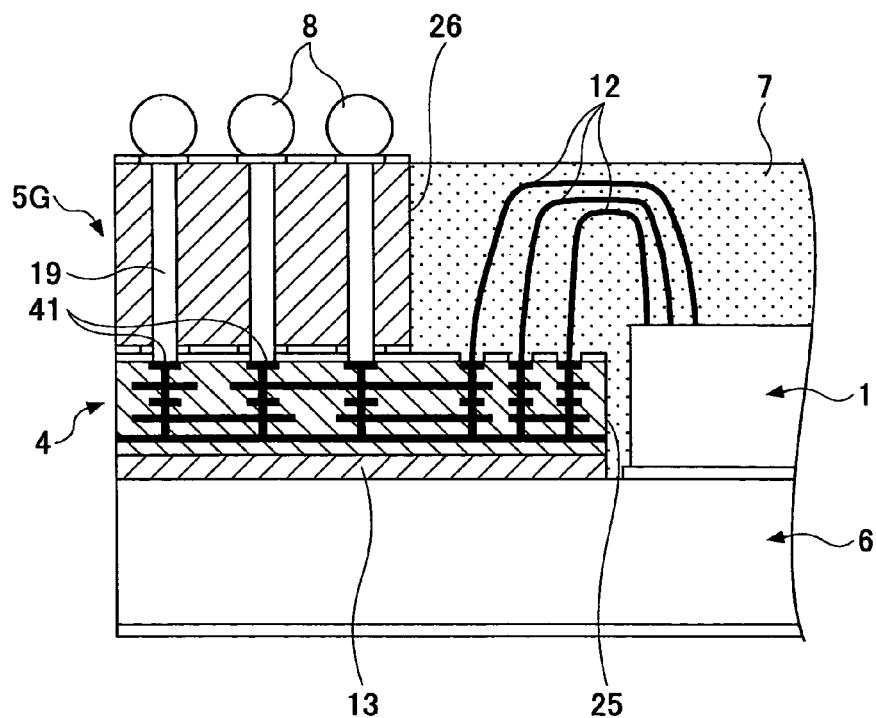
FIG. 19 is a cross-sectional view of part of a semiconductor device according to an $18^{th}$ embodiment of the present invention.

FIG. 19 shows the semiconductor device according to the $18^{th}$ embodiment of the present invention. In the semiconductor device according to this embodiment, the circuit board 4 and an interposer 5G are electrically connected using metal diffusion. Specifically, the lower end of each through hole 19 formed in the interposer 5G is brought into direct contact with a corresponding electrode on the circuit board 4. In this state, pressing and heating are performed. As a result, a bonding force is generated between the metal surface of the lower end of each through hole 19 and the corresponding electrode surface of the circuit board 4, so that the metal surface of the lower end of each through hole 19 and the corresponding electrode surface of the circuit board 4 are bonded.

According to the semiconductor device of this embodiment, it is possible to dispense with the solder bumps 22 and the anisotropic conductive member 40. As a result, the number of components and the cost of the semiconductor device can be reduced. Further, since the interposer 5A is joined directly to the circuit board 4, the semiconductor device can be reduced in thickness.

Figure 20:
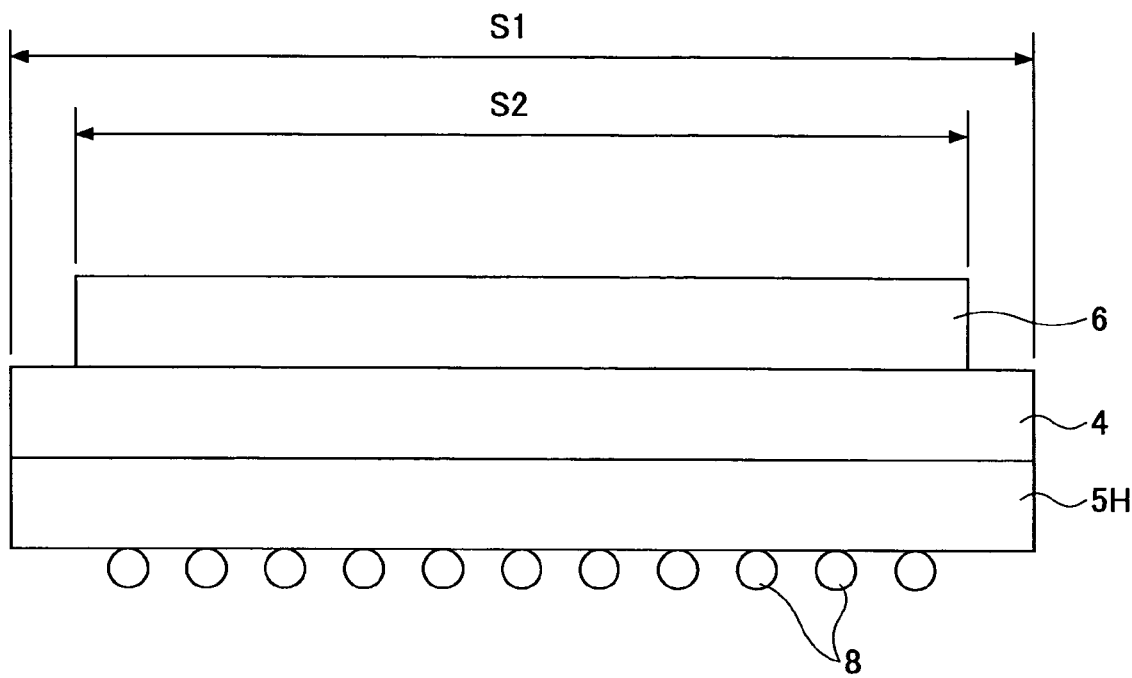
FIG. 20 is a cross-sectional view of part of a semiconductor device according to a $19^{th}$ embodiment of the present invention.
Figure 21:
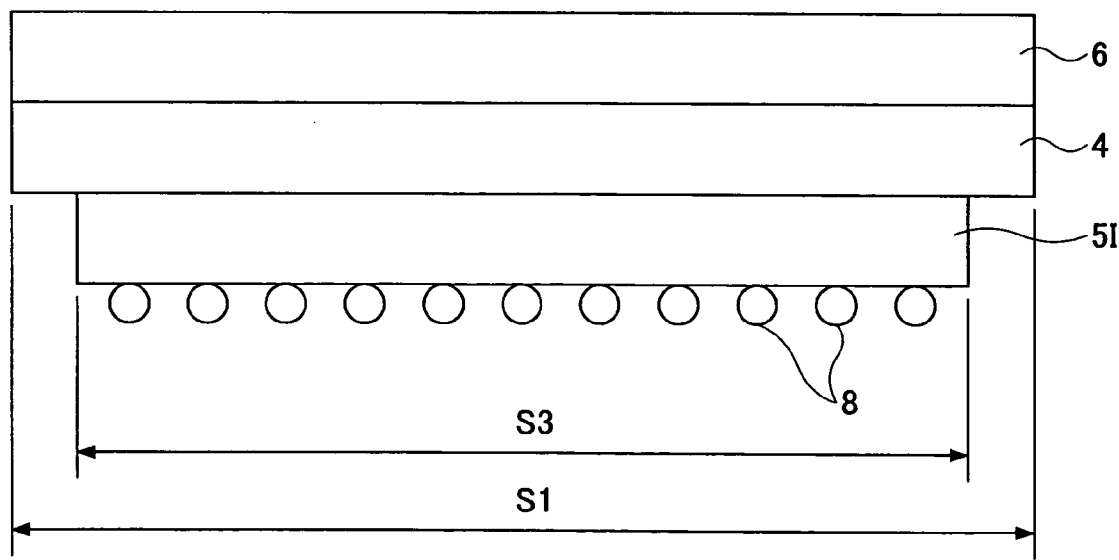
FIG. 21 is a cross-sectional view of part of a semiconductor device according to a $20^{th}$ embodiment of the present invention.

FIGS. 20 and 21 show the semiconductor devices according to the $19^{th}$ and $20^{th}$ embodiments of the present invention. In the semiconductor devices of these embodiments, the size of the heat dissipation plate 6 (FIG. 20) or an interposer 5I (FIG. 21) is changed with respect to the shape (outer form) of the circuit board 4. In the semiconductor device shown in FIG. 20, the circuit board 4 (as well as an interposer 5H) has an area S1 while the heat dissipation plate 6 has an area S2, which is smaller than the area S1 (S2<S1). On the other hand, in the semiconductor device shown in FIG. 21, the circuit board 4 (as well as the heat dissipation plate 6) has the area S1 while the interposer 5I has an area S3, which is smaller than the area S1 (S3<S1).

According to the semiconductor device shown in FIG. 20, a difference in level (or a step-like part) is formed between the heat dissipation plate 6 and the circuit board 4. Accordingly, it is possible to handle the semiconductor device using this step-like part, so that the semiconductor device can be carried satisfactorily. On the other hand, according to the semiconductor device shown in FIG. 21, the heat dissipation plate 6 is greater in size than the interposer 5I. Accordingly, heat dissipation efficiency can be improved.

The present invention is not limited to the specifically disclosed embodiments, and variations and modifications may be made without departing from the scope of the present invention.

What is claimed is:

1. A semiconductor device, comprising:
   a semiconductor element;
   a circuit board electrically connected to the semiconductor element;
   a heat dissipation member fixed to a first surface of the circuit board and thermally coupled to the semiconductor element; and
   an interposer provided to a second surface of the circuit board facing away from the heat dissipation member, the interposer being electrically connected to the circuit board, the interposer comprising a base material having at least one through hole formed therethrough, wherein the top of each through hole has formed thereon an upper electrode, and the bottom of each through hole has formed thereon a lower electrode; and
   a conductor material provided between the interposer and the circuit board, the conductive material mechanically fixing and electrically connecting the interposer and the circuit board,
   wherein an opening is formed in the circuit board and the interposer so that the semiconductor element is thermally coupled directly to the heat dissipation member through the opening.

2. The semiconductor device as claimed in claim 1, wherein the heat dissipation member is a flat plate.

3. The semiconductor device as claimed in claim 1, wherein a surface of the heat dissipation member to which the semiconductor element is joined is flat.

4. The semiconductor device as claimed in claim 1, wherein the heat dissipation member comprises material that is higher than or equal to 100 W/m/K and lower than or equal to 3000 W/m/K in thermal conductivity.

5. The semiconductor device as claimed in claim 4, wherein the heat dissipation member comprises a metal selected from a group of copper, nickel, and aluminum.

6. The semiconductor device as claimed in claim 4, wherein the heat dissipation member comprises a ceramic material.

7. The semiconductor device as claimed in claim 4, wherein the heat dissipation member comprises a carboniferous substance containing carbon as a principal component thereof.

8. The semiconductor device as claimed in claim 7, wherein the carboniferous substance is diamond or carbon nanotubes.

9. The semiconductor device as claimed in claim 1, wherein the circuit board is a multilayer circuit board.

10. The semiconductor device as claimed in claim 1, wherein the heat dissipation member comprises a conductive material and is electrically connected to the circuit board.

11. The semiconductor device as claimed in claim 1, wherein the semiconductor element and the circuit board are connected with wires.

12. The semiconductor device as claimed in claim 1, wherein the semiconductor element and the circuit board are connected by tape automated bonding.

13. The semiconductor device as claimed in claim 1, wherein the semiconductor element and the circuit board are connected by flip-chip bonding.

14. The semiconductor device as claimed in claim 1, wherein the semiconductor element provided in the opening comprises a plurality of semiconductor element parts.

15. The semiconductor device as claimed in claim 14, wherein the semiconductor element parts are stacked in the opening.

16. The semiconductor device as claimed in claim 1, wherein a base material of the interposer and a base material of the circuit board are a same material.

17. The semiconductor device as claimed in claim 1, wherein a base material of the interposer has a coefficient of thermal expansion substantially equal to that of a base material of the circuit board.

18. The semiconductor device as claimed in claim 1, wherein a base material of the interposer is a ceramic material.

19. The semiconductor device as claimed in claim 18, wherein the ceramic material is a low temperature sintering ceramic material.

20. The semiconductor device as claimed in claim 1, wherein the interposer has a passive element provided therein.

21. The semiconductor device as claimed in claim 1, wherein a number of external connection terminals provided to the interposer is equal to a number of terminals of the circuit board for connection thereof to the interposer.

22. The semiconductor device as claimed in claim 1, wherein a number of external connection terminals provided to the interposer is different from a number of terminals of the circuit board for connection thereof to the interposer.

23. The semiconductor device as claimed in claim 1, wherein a position on the interposer where an external connection terminal is provided coincides with a position on the interposer where a corresponding terminal for connection thereof to the circuit board is provided when the interposer is viewed two-dimensionally in a direction toward the circuit board.

24. The semiconductor device as claimed in claim 1, wherein a position on the interposer where an external connection terminal is provided is offset from a position on the circuit board where a corresponding terminal for connection thereof to the interposer is provided when the interposer is viewed two-dimensionally in a direction toward the circuit board.

25. The semiconductor device as claimed in claim 1, wherein the opening comprises a plurality of opening parts and the semiconductor element comprises a plurality of semiconductor element parts so that the semiconductor element parts are provided in the corresponding opening parts.

26. The semiconductor device as claimed in claim 1, wherein the opening is formed by punching or routing.

27. The semiconductor device as claimed in claim 1, wherein the circuit board and the interposer are electrically connected using solder.

28. The semiconductor device as claimed in claim 1, wherein the circuit board and the interposer are electrically connected using an anisotropic conductive substance.

29. The semiconductor device as claimed in claim 1, wherein the interposer has an external connection terminal provided thereto, the external connection terminal comprising a ball.

30. The semiconductor device as claimed in claim 1, wherein the interposer is equal in size to the circuit board.

31. The semiconductor device as claimed in claim 1, wherein the interposer is greater in size than the circuit board.

32. The semiconductor device as claimed in claim 1, wherein the interposer is smaller in size than the circuit board.

33. A semiconductor device, comprising:

a semiconductor element;

a circuit board electrically connected to the semiconductor element;

a heat dissipation member fixed to a first surface of the circuit board and thermally coupled to the semiconductor element;

an interposer provided to a second surface of the circuit board facing away from the heat dissipation member, the interposer being electrically connected to the circuit board, the interposer comprising a base material having at least one through hole formed therethrough, wherein the at least one through hole has a first end and a second end; and an electrode formed on the interposer at the first end of the at least one through hole, wherein an opening is formed in the circuit board and the interposer so that the semiconductor element is thermally coupled directly to the heat dissipation member through the opening, and the second end of the at least one through hole of the interposer is in direct contact with an electrode on the circuit board through metal diffusion.

34. The semiconductor device as claimed in claim 30, wherein the circuit board and the interposer are electrically connected using the metal diffusion.

* * * * *